(12) United States Patent
Luby

(10) Patent No.: US 7,812,743 B2
(45) Date of Patent: Oct. 12, 2010

(54) INFORMATION ADDITIVE CODE GENERATOR AND DECODER FOR COMMUNICATION SYSTEMS

(75) Inventor: Michael G. Luby, Berkeley, CA (US)

(73) Assignee: Digital Fountain Inc., San Diego, CA (US)

( * ) Notice: Subject to any disclaimer, the term of this patent is extended or adjusted under 35 U.S.C. 154(b) by 0 days.

(21) Appl. No.: 11/841,954

(22) Filed: Aug. 20, 2007

(65) Prior Publication Data

US 2008/0180284 A1 Jul. 31, 2008

Related U.S. Application Data

(63) Continuation of application No. 11/738,866, filed on Apr. 23, 2007, which is a continuation of application No. 11/226,919, filed on Sep. 13, 2005, now Pat. No. 7,233,264, which is a continuation of application No. 10/600,484, filed on Jun. 19, 2003, now Pat. No. 7,057,534, which is a continuation of application No. 10/076,623, filed on Feb. 14, 2002, now Pat. No. 6,614,366, which is a continuation of application No. 09/757,078, filed on Jan. 8, 2001, now Pat. No. 6,373,406, which is a continuation of application No. 09/246,015, filed on Feb. 5, 1999, now Pat. No. 6,307,487.

(60) Provisional application No. 60/101,473, filed on Sep. 23, 1998.

(51) Int. Cl.
*H03M 7/00* (2006.01)
(52) U.S. Cl. .......................................... 341/50; 714/15
(58) Field of Classification Search ................... 341/50, 341/55, 60; 714/15; 709/207
See application file for complete search history.

(56) References Cited

U.S. PATENT DOCUMENTS 3,909,721 A 9/1975 Bussgang et al.

(Continued)

FOREIGN PATENT DOCUMENTS

EP 0854650 7/1998

(Continued)

OTHER PUBLICATIONS

International Search Report - PCT/US99/021574 - ISA/EPO - Jan. 28, 2000.

(Continued)

*Primary Examiner*—Peguy JeanPierre
(74) *Attorney, Agent, or Firm*—Jeffrey D. Jacobs

(57) ABSTRACT

An encoder uses an input file of data and a key to produce an output symbol. An output symbol with key I is generated by determining a weight, W(I), for the output symbol to be generated, selecting W(I) of the input symbols associated with the output symbol according to a function of I, and generating the output symbol's value B(I) from a predetermined value function F(I) of the selected W(I) input symbols. An encoder can be called repeatedly to generate multiple output symbols. The output symbols are generally independent of each other, and an unbounded number (subject to the resolution of I) can be generated, if needed. A decoder receives some or all of the output symbols generated. The number of output symbols needed to decode an input file is equal to, or slightly greater than, the number of input symbols comprising the file, assuming that input symbols and output symbols represent the same number of bits of data.

26 Claims, 18 Drawing Sheets

U.S. PATENT DOCUMENTS

| | | | |
|---|---|---|---|
| 4,365,338 A * | 12/1982 | McRae et al. | 375/230 |
| 4,589,112 A | 5/1986 | Karim | |
| 5,331,320 A | 7/1994 | Cideciyan et al. | |
| 5,432,787 A | 7/1995 | Chethik | |
| 5,455,823 A | 10/1995 | Noreen et al. | |
| 5,608,738 A | 3/1997 | Matsushita | |
| 5,617,541 A * | 4/1997 | Albanese et al. | 709/207 |
| 5,805,825 A | 9/1998 | Danneels et al. | |
| 5,933,056 A | 8/1999 | Rothenberg et al. | |
| 5,953,537 A * | 9/1999 | Balicki et al. | 712/1 |
| 5,970,098 A | 10/1999 | Herzberg | |
| 5,983,383 A | 11/1999 | Wolf | |
| 5,993,056 A | 11/1999 | Vaman | |
| 6,044,485 A | 3/2000 | Dent et al. | |
| 6,073,250 A | 6/2000 | Luy et al. | |
| 6,081,909 A | 6/2000 | Luby et al. | |
| 6,081,918 A | 6/2000 | Spielman | |
| 6,097,320 A * | 8/2000 | Kuki et al. | 341/58 |
| 6,163,870 A | 12/2000 | Luby et al. | |
| 6,178,536 B1 * | 1/2001 | Sorkin | 714/766 |
| 6,195,777 B1 | 2/2001 | Luby et al. | |
| 6,223,324 B1 | 4/2001 | Sinha et al. | |
| 6,307,487 B1 | 10/2001 | Luby et al. | |
| 6,320,520 B1 | 11/2001 | Luby | |
| 6,333,926 B1 | 12/2001 | Van Heeswyk et al. | |
| 6,373,406 B2 | 4/2002 | Lubyy et al. | |
| 6,411,223 B1 | 6/2002 | Haken et al. | |
| 6,420,982 B1 * | 7/2002 | Brown | 341/106 |
| 6,430,233 B1 | 8/2002 | Dillon et al. | |
| 6,473,010 B1 | 10/2002 | Vityaev | |
| 6,486,803 B1 * | 11/2002 | Luby et al. | 341/50 |
| 6,643,332 B1 | 11/2003 | Morelos-Zaragoza et al. | |
| 6,742,154 B1 | 5/2004 | Barnard | |
| 6,849,803 B1 | 2/2005 | Gretz | |
| 6,850,736 B2 | 2/2005 | McCune, Jr. | |
| 6,856,263 B2 | 2/2005 | Shokrollahi et al. | |
| 6,909,383 B2 | 6/2005 | Shokrollahi et al. | |
| 7,030,785 B2 * | 4/2006 | Shokrollahi et al. | 341/50 |
| 7,068,729 B2 | 6/2006 | Shokrollahi | |
| 7,168,030 B2 | 1/2007 | Ariyoshii et al. | |
| 7,418,651 B2 | 8/2008 | Luby et al. | |
| 2002/0081977 A1 | 6/2002 | McCune, Jr. et al. | |
| 2003/0058958 A1 | 3/2003 | Shokrollahi et al. | |
| 2007/0195894 A1 | 8/2007 | Shokrollahi et al. | |
| 2007/0300127 A1 | 12/2007 | Watson et al. | |

FOREIGN PATENT DOCUMENTS

| | | |
|---|---|---|
| WO | 9634463 | 10/1996 |
| WO | 9832231 | 7/1998 |
| WO | WO0018017 A1 | 3/2000 |
| WO | WO0120786 A1 | 3/2001 |

OTHER PUBLICATIONS

International Search Report - PCT/US00/025405 - ISA/EPO - Mar. 1, 2001.

International Preliminary Examination Report - PCT/US00/025405 - Oct. 29, 2001.

European Search Report - EP02007488 - Search Authority - Munich Patent Office - Mar. 24, 2003.

Alon et al., "Linear Time Erasure Codes With Nearly Optimal Recovery," Proceedings Of The Annual Symposium On Foundations Of Computer Science, US, Los Alamitos, IEEE Comp. Soc. Press, vol. Symp. 36, pp. 512-516 (Oct. 23, 1995).

Bigloo et al. "A Robust Rate-Adaptive Hybrid ARQ Scheme For Frequency-Hopped Spread-Spectrum Multiple-Access Communication Systems" IEEE Journal On Selected Areas in Communications, US, IEEE Inc, New York, (Jun. 1, 1994) pp. 917-924.

Blomer et al., "An XOR-Based Erasure-Resent Coding Scheme," ICSI Technical Report No. TR-95-048 (1995).

Byers et al., "Accessing Multiple Mirror Sites in Parallel: Using Tornado Codes to Speed Up Downloads," International Computer Science Institute Technical Report TR-98-021 (1998), p. 1.

Byers et al., "A Digital Fountain Approach to Reliable Distribution of Bulk Data", International Computer Science Institute Technical Report TR-98-013 (May 1998).

Gemmell, et al., "A Scalable Multicast Architecture for One-To-Many Telepresentations", Multimedia Computing and Systems, 1998/ Proceedings. IEEE International Conference on Austin, TX, USA Jun. 28-Jul. 1, 1998, Los Alamitos, CA USA, IEEE Comput. Soc, US Esaki et al. "Reliable IP Multicast Communication Over ATM Networks Using Forward Error Correction Policy" IEICE Transactions On Communications, JP, Institute of Electronics Information and Comm. Eng. Tokyo, vol. E78-V, No. 12.

Hershey, et al., "Random Parity Coding (RPC)", 1996 IEEE International Conference on Communications (ICC) Converging Technologies for Tomorrows Applications. Dallas, Jun. 23-27, 1983, IEEE International Conference on Communications (ICC), New York, IEEE.

Kallel, "Complementary Punctured Convolutional (CPC) Codes and Their Applications", IEEE Transactions on Communications, IEEE Inc., New York, US, vol. 43, No. 6, Jun. 1, 1995, pp. 2005-2009.

Luby et al., "Analysis of Low Density Codes and Improved Designs Using Irregular Graphs", International Computer Science Institute Technical Report TR-97-045 (Nov. 1997).

Luby et al., "Analysis of Random Processes via And-Or Tree Evaluation," ICSI Technical Report No. TR-97-042 (1997) and Proceedings of the 9th Annual ACM Symposium on Discrete Algorithms (1998).

Luby et al., "Improved Low-density Parity-Check Codes Using Irregular Graphs and Belief Propagation", International Computer Science Institute Technical Report TR-97-044(Nov. 1997).

Luby et al., "Tornado Codes," Practical Loss-Resilient Codes, 29th Annual ACM Symposium on Theory of Computing (1997).

Narayanan, et al., "Physical Layer Design for Packet Data Over IS-136", Vehicular Technology Conference, 1997, IEEE 47th Phoenix, AZ, USA May 4-7, 1997, New York, NY, USA, IEEE, US May 4, 1997, pp. 1029-1033.

Nonnenmacher, et al., "Parity-Based Loss Recovery for Reliable Multicast Transmission", IEEE / ACM Transactions on Networking, IEEE Inc. New York, US, vol. 6, No. 4, Aug. 1, 1998, pp. 349-361.

Pursley et al., "Variable-Rate Coding For Meteor-Burst Communications" IEEE Transactions on Communications, US, IEEE Inc. New York (1989) vol. 37, No. 11, pp. 1105-1112.

Seshan et al., "Handoffs In Cellular Wireless Networks: The Daedalus Implementation and Experience," Wireless Personal Communications, NL; Kluwer Scademic Publishers, vol. 4, No. 2, Mar. 1, 1997, pp. 141-162.

Shacham, N., "Packet Recovery And Error Correction in High-Speed Wide-Area Networks," Proceedings Of The Military Communications Conference, (Milcom), US, New York, IEEE, vol. 1, pp. 551-557, (1989).

Bitner, J.R., et al.: "Efficient generation of the binary reflected Gray code and its Applications," Communications of the ACM (1976).

Clark, C.C. et al.: "Error Correction Coding for Digital Communications, System Applications," 1981, Plenum Press New York, pp. 339-341.

Digital Fountain: "Raptor code specification for MBMS file download," 3GPP SA4 PSM AD-HOC #31 (May 21, 2004) XP002355055 pp. 1-6.

Digital Fountain: "Specification Text for Raptor Forward Error Correction," TDOC S4-050249 of 3GPP TSG SA WG 4 Meeting #34 [Online] (Feb. 25, 2005) pp. 1-23, XP002425167, Retrieved from the Internet: URL:http://www.3gpp.org/ftp/tsg_sa/WG4_CODEC/TSGS4_34/Docs.

Luby, M. et al.: "Efficient Erasure Correction Codes," 2001, IEEE Transactions on Information Theory. Vo. 47, No. 2, pp. 569-584.

Pursley, M. et al.: A Correction and an Addendum for "Variable-Rate Coding for Meteor-Burst Communications," IEEE Transactions on Communications, vol. 43, No. 12 pp. 2866-2867 (Dec. 1995).

Rizzo, L.: "Effective Erasure Codes for Reliable Computer Communication Protocols," Computer Communication Review, Association for Computing Machinery, vol. 27, No. 2, pp. 24-36.

Shokroilhai, A.: "Raptor Codes," Internet Citation [Oniine] (Jan. 13, 2004) XP002367883, Retrieved from the Internet URL:http://www.cs.huji.ac.il/labs/danss/p2p/resources/raptor.pdf.

Lin, S. et al.: "Error Control Coding-Fundamentals and Applications." 1983, Englewood Cliffs, pp. 288.

Byers et al., "A Digital Fountain Approach to Reliable Distribution of Bulk Data," ICSI Technical Report No. TR-98-005 (1998) and Proceedings of the ACM SIGCOMM '98 Conference (1998).

Byers, et al., "Accessing Multiple Mirror Sites In Parallel: Using Tornado Codes To Speed Up Downloads", 1999, Eighteenth Annual Joint Conference Of The IEEE Computer And Communications Societies, pp. 275-283.

Esaki, et al.: "Reliable IP Multicast Communication Over ATM Networks Using Forward Error Correction Policy," IEICE Transactions on Communications, JP, Institute of Electronics Information and Comm. ENG. Tokyo, vol. E78-V, No. 12 (Dec. 1, 1995) pp. 1622-1637.

Luby, et al., "Analysis Of Low Density Codes And Improved Designs Using Irregular Graphs", 1998, Proceedings Of The 30th Annual ACM Symposium On Theory Of Computing, 1998, pp. 249-258.

Shu, et al., "Error Control Coding-Fundamentals And Applications", 1983, Englewood Cliffs, pp. 288.

\* cited by examiner

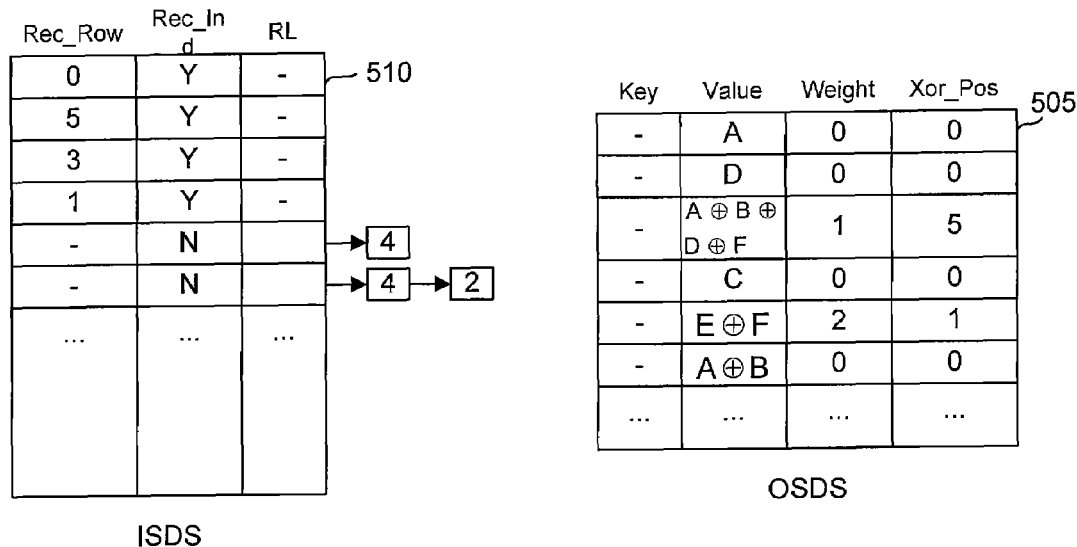
Figure 17
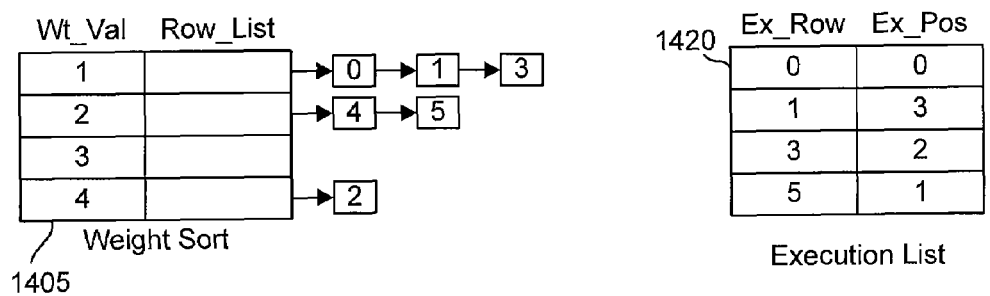
Figure 18
Figure 19

INFORMATION ADDITIVE CODE GENERATOR AND DECODER FOR COMMUNICATION SYSTEMS

CROSS REFERENCES TO RELATED APPLICATIONS

This application is a continuation of U.S. patent application Ser. No. 11/738,866, filed Apr. 23, 2007 which is a continuation of U.S. Pat. No. 7,233,264, issued Jun. 19, 2007, which is a continuation of U.S. Pat. No. 7,057,534, which is a continuation of U.S. patent application Ser. No. 10/076,623, filed Feb. 14, 2002, issued as U.S. Pat. No. 6,614,366, which is a continuation of U.S. patent application Ser. No. 09/757,078, filed Jan. 8, 2001, issued as U.S. Pat. No. 6,373,406, which is a continuation of U.S. patent application Ser. No. 09/246,015, filed Feb. 5, 1999, issued as U.S. Pat. No. 6,307,487, which claims priority to U.S. Provisional Patent Application No. 60/101,473, filed Sep. 23, 1998, now abandoned, the disclosures of which are incorporated herein by reference for all purposes.

BACKGROUND OF THE INVENTION

The present invention relates to encoding and decoding data in communications systems and more specifically to communication systems that encode and decode data to account for errors and gaps in communicated data, and to efficiently utilize communicated data emanating from more than one source.

Transmission of files between a sender and a recipient over a communications channel has been the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than garbled data (errors) because the recipient cannot always tell when garbled data is data received in error. Many error correcting codes have been developed to correct for erasures (so called "erasure codes") and/or for errors ("error-correcting codes", or "ECC's"). Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected a simple parity code might be best.

File transmission between multiple senders and/or multiple receivers over a communications channel has also been the subject of much literature. Typically, file transmission from multiple senders requires coordination among the multiple senders to allow the senders to minimize duplication of efforts. In a typical multiple sender system sending one file to a receiver, if the senders do not coordinate which data they will transmit and when, but instead just send segments of the file, it is likely that a receiver will receive many useless duplicate segments. Similarly, where different receivers join a transmission from a sender at different points in time, a concern is how to ensure that all data the receivers receive from the sender is useful. For example, suppose the sender is continuously transmitting data about the same file. If the sender just sends segments of the original file and some segments are lost, it is likely that a receiver will receive many useless duplicate segments before receiving one copy of each segment in the file.

Another consideration in selecting a code is the protocol used for transmission. In the case of the global internetwork of networks known as the "Internet" (with a capital "I"), a packet protocol is used for data transport. That protocol is called the Internet Protocol or "IP" for short. When a file or other block of data is to be transmitted over an IP network, it is partitioned into equal size input symbols and input symbols are placed into consecutive packets. Being packet-based, a packet oriented coding scheme might be suitable. The "size" of an input symbol can be measured in bits, whether or not the input symbol is actually broken into a bit stream, where an input symbol has a size of M bits when the input symbol is selected from an alphabet of $2^M$ symbols.

The Transport Control Protocol ("TCP") is a point-to-point packet control scheme in common use that has an acknowledgment mechanism. TCP is good for one-to-one communications, where the sender and recipient both agree on when the transmission will take place and be received and both agree on which transmitters and receivers will be used. However, TCP is often not suitable for one-to-many or many-to-many communications or where the sender and the recipient independently determine when and where they will transmit or receive data.

Using TCP, a sender transmits ordered packets and the recipient acknowledges receipt of each packet. If a packet is lost, no acknowledgment will be sent to the sender and the sender will resend the packet. Packet loss has a number of causes. On the Internet, packet loss often occurs because sporadic congestion causes the buffering mechanism in a router to reach its capacity, forcing it to drop incoming packets. With protocols such as TCP/IP, the acknowledgment paradigm allows packets to be lost without total failure, since lost packets can just be retransmitted, either in response to a lack of acknowledgment or in response to an explicit request from the recipient. Either way, an acknowledgment protocol requires a back channel from the recipient to the sender.

Although acknowledgment-based protocols are generally suitable for many applications and are in fact widely used over the current Internet, they are inefficient, and sometimes completely infeasible, for certain applications. In particular, acknowledgment-based protocols perform poorly in networks with high latencies, high packet loss rates, uncoordinated recipient joins and leaves, and/or highly asymmetric bandwidth. High latency is where acknowledgments take a long time to travel from the recipient back to the sender. High latency may result in the overall time before a retransmission being prohibitively long. High packet loss rates also cause problems where several retransmissions of the same packet may fail to arrive, leading to a long delay to obtain the last one or last few unlucky packets.

"Uncoordinated recipient joins and leaves" refers to the situation where each recipient can join and leave an ongoing transmission session at their own discretion. This situation is typical on the Internet, next-generation services such as "video on demand" and other services to be offered by network providers in the future. In the typical system, if a recipient joins and leaves an ongoing transmission without coordination of the senders, the recipient will likely perceive a loss of large numbers of packets, with widely disparate loss patterns perceived by different recipients.

Asymmetric bandwidth refers to the situation is where a reverse data path from recipient to sender (the back channel) is less available or more costly than the forward path. Asymmetric bandwidth may make it prohibitively slow and/or expensive for the recipient to acknowledge packets frequently and infrequent acknowledgments may again introduce delays.

Furthermore, acknowledgment-based protocols do not scale well to broadcasting, where one sender is sending a file simultaneously to multiple users. For example, suppose a sender is broadcasting a file to multiple recipients over a satellite channel. Each recipient may experience a different pattern of packet loss. Protocols that rely on acknowledgment data (either positive or negative) for reliable delivery of the file require a back channel from each recipient to the sender, and this can be prohibitively expensive to provide. Furthermore, this requires a complex and powerful sender to be able to properly handle all of the acknowledgment data sent from the recipients. Another drawback is that if different recipients lose different sets of packets, rebroadcast of packets missed only by a few of the recipients causes reception of useless duplicate packets by other recipients. Another situation that is not handled well in an acknowledgment-based communication system is where recipients can begin a receiving session asynchronously, i.e., the recipient could begin receiving data in the middle of a transmission session.

Several complex schemes have been suggested to improve the performance of acknowledgment-based schemes, such as TCP/IP for multicast and broadcast. However none has been clearly adopted at this time, for various reasons. For one, acknowledgment-based protocols also do not scale well where one recipient is obtaining information from multiple senders, such as in a low earth orbit ("LEO") satellite broadcast network. In an LEO network, the LEO satellites pass overhead quickly because of their orbit, so the recipient is only in view of any particular satellite for a short time. To make up for this, the LEO network comprises many satellites and recipients are handed off between satellites as one satellite goes below the horizon and another rises. If an acknowledgment-based protocol were used to ensure reliability, a complex hand-off protocol would probably be required to coordinate acknowledgments returning to the appropriate satellite, as a recipient would often be receiving a packet from one satellite yet be acknowledging that packet to another satellite.

An alternative to an acknowledgment-based protocol that is sometimes used in practice is a carousel-based protocol. A carousel protocol partitions an input file into equal length input symbols, places each input symbol into a packet, and then continually cycles through and transmits all the packets. A major drawback with a carousel-based protocol is that if a recipient misses even one packet, then the recipient has to wait another entire cycle before having a chance at receiving the missed packet. Another way to view this is that a carousel-based protocol can cause a large amount of useless duplicate data reception. For example, if a recipient receives packets from the beginning of the carousel, stops reception for a while, and then starts receiving again at the beginning of the carousel, a large number of useless duplicate packets are received.

One solution that has been proposed to solve the above problems is to avoid the use of an acknowledgment-based protocol, and instead use erasure codes such as Reed-Solomon Codes to increase reliability. One feature of several erasure codes is that, when a file is segmented into input symbols that are sent in packets to the recipient, the recipient can decode the packets to reconstruct the entire file once sufficiently many packets are received, generally regardless of which packets arrive. This property removes the need for acknowledgments at the packet level, since the file can be recovered even if packets are lost. However, many erasure code solutions either fail to solve the problems of acknowledgment-based protocol or raise new problems.

One problem with many erasure codes is that they require excessive computing power or memory to operate. One coding scheme that has been recently developed for communications applications that is somewhat efficient in its use of computing power and memory is the Tornado coding scheme. Tornado codes are similar to Reed-Solomon codes in that an input file is represented by K input symbols and is used to determine N output symbols, where N is fixed before the encoding process begins. Encoding with Tornado codes is generally much faster than encoding with Reed-Solomon codes, as the average number of arithmetic operations required to create the N Tornado output symbols is proportional to N (on the order of tens of assembly code operations times N) and the total number of arithmetic operations required to decode the entire file is also proportional to N.

Tornado codes have speed advantages over Reed-Solomon codes, but with several disadvantages. First, the number of output symbols, N, must be determined in advance of the coding process. This leads to inefficiencies if the loss rate of packets is overestimated, and can lead to failure if the loss rate of packets is underestimated. This is because a Tornado decoder requires a certain number of output symbols (specifically, K+A packets, where A is small compared to K) to decode and restore the original file and if the number of lost packets is greater than N−(K+A), then the original file cannot be restored. This limitation is generally acceptable for many communications problems, so long as N is selected to be greater than K+A by at least the actual packet loss, but this requires an advance guess at the packet loss.

Another disadvantage of Tornado codes is that they require the encoder and decoder to agree in some manner on a graph structure. Tornado codes require a pre-processing stage at the decoder where this graph is constructed, a process that slows the decoding substantially. Furthermore, a graph is specific to a file size, so a new graph needs to be generated for each file size used. Furthermore, the graphs needed by the Tornado codes are complicated to construct, and require different custom settings of parameters for different sized files to obtain the best performance. These graphs are of significant size and require a significant amount of memory for their storage at both the sender and the recipient.

In addition, Tornado codes generate exactly the same output symbol values with respect to a fixed graph and input file. These output symbols consist of the K original input symbols and N−K redundant symbols. Furthermore, N can practically only be a small multiple of K, such as 1.5 or 2 times K. Thus, it is very likely that a recipient obtaining output symbols generated from the same input file using the same graph from more than one sender will receive a large number of useless duplicate output symbols. That is because the N output symbols are fixed ahead of time and are the same N output symbols that are transmitted from each transmitter each time the symbols are sent and are the same N symbols received by a receiver. For example, suppose N=1500, K=1000 and a receiver receives 900 symbols from one satellite before that satellite dips over the horizon. Unless the satellites are coordinated and in sync, the Tornado code symbols received by the receiver from the next satellite might not be additive because that next satellite is transmitting the same N symbols, which is likely to result in the receiver receiving copies of many of the already received 900 symbols before receiving 100 new symbols needed to recover the input file.

Therefore, what is needed is a simple erasure code that does not require excessive computing power or memory at a sender or recipient to implement, and that can be used to efficiently distribute a file in a system with one or more senders and/or one or more recipients without necessarily needing coordination between senders and recipients.

SUMMARY OF THE INVENTION

In one embodiment of a communications system according to the present invention, an encoder uses an input file of data and a key to produce an output symbol, wherein the input file is an ordered plurality of input symbols each selected from an input alphabet, the key is selected from a key alphabet, and the output symbol is selected from an output alphabet. An output symbol with key I is generated by determining a weight, W(I), for the output symbol to be generated, wherein the weights W are positive integers that vary between at least two values over the plurality of keys, selecting W(I) of the input symbols associated with the output symbol according to a function of I, and generating the output symbol's value B(I) from a predetermined value function F(I) of the selected W(I) input symbols. The encoder may be called one or more times, each time with another key, and each such time it produces an output symbol. The output symbols are generally independent of each other, and an unbounded number (subject to the resolution of I) can be generated, if needed.

In a decoder according to the present invention, output symbols received by a recipient are output symbols transmitted from a sender, which generated those output symbols based on an encoding of an input file. Because output symbols can be lost in transit, the decoder operates properly even when it only receives an arbitrary portion of the transmitted output symbols. The number of output symbols needed to decode the input file is equal to, or slightly greater than, the number of input symbols comprising the file, assuming that input symbols and output symbols represent the same number of bits of data.

In one decoding process according to the present invention, the following steps are performed for each received output symbol: 1) identify the key I of the received output symbol; 2) identify the received output symbol value B(I) for output symbol; 3) determine the weight, W(I), of the output symbol, 4) determine positions for the W(I) associated input symbols associated with the output symbol, and 5) store B(I) in an output symbol table along with the weight W(I) and the positions of the associated input symbols. The following process is then applied repeatedly until there are no more unused output symbols of weight one: 1) for each stored output symbol that has a weight of one and is not denoted as a "used up" output symbol, calculate the position J of the unique remaining unrecovered input symbol associated with the output symbol based on its key I; 2) calculate the value for input symbol J from the output symbol; 3) identify the output symbols in the output symbol table that have input symbol J as an associate; 4) recalculate the values B for the identified output symbols so that they are independent of input symbol J; 5) decrement by one the weights of these identified output symbols; and 6) denote input symbol J as recovered and the output symbol with key I as used up. This process is repeated until the ordered set of input symbols is recovered, i.e., until the entire input file is completely recovered.

One advantage of the present invention is that it does not require that the recipient begin receiving at any given point in the transmission and it does not require that the sender stop after a set number of output symbols are generated, since the sender can send an effectively unbounded set of output symbols for any given input file. Instead, a recipient can begin reception when it is ready, and from wherever it can, and can lose packets in a random pattern, and still have a good chance that the great majority of the data received is "information additive" data, i.e., data that helps in the recovery process rather than being duplicative of information already available. The fact that independently generated (often randomly unrelated) data streams are coded in an information additive way leads to many advantages in that it allows for multiple source generation and reception, erasure robustness and uncoordinated joins and leaves.

A further understanding of the nature and the advantages of the inventions disclosed herein may be realized by reference to the remaining portions of the specification and the attached drawings.

BRIEF DESCRIPTION OF THE DRAWINGS

FIG. 17 illustrates the contents of tables in a decoder during the decoding process shown in FIG. 15.

FIG. 18 is a diagram illustrating the contents of a weight sort table as might be used during the decoding process shown in FIG. 15.

FIG. 19 illustrates an execution list that might be formed during the decoding process shown in FIG. 15.

Figure 1:
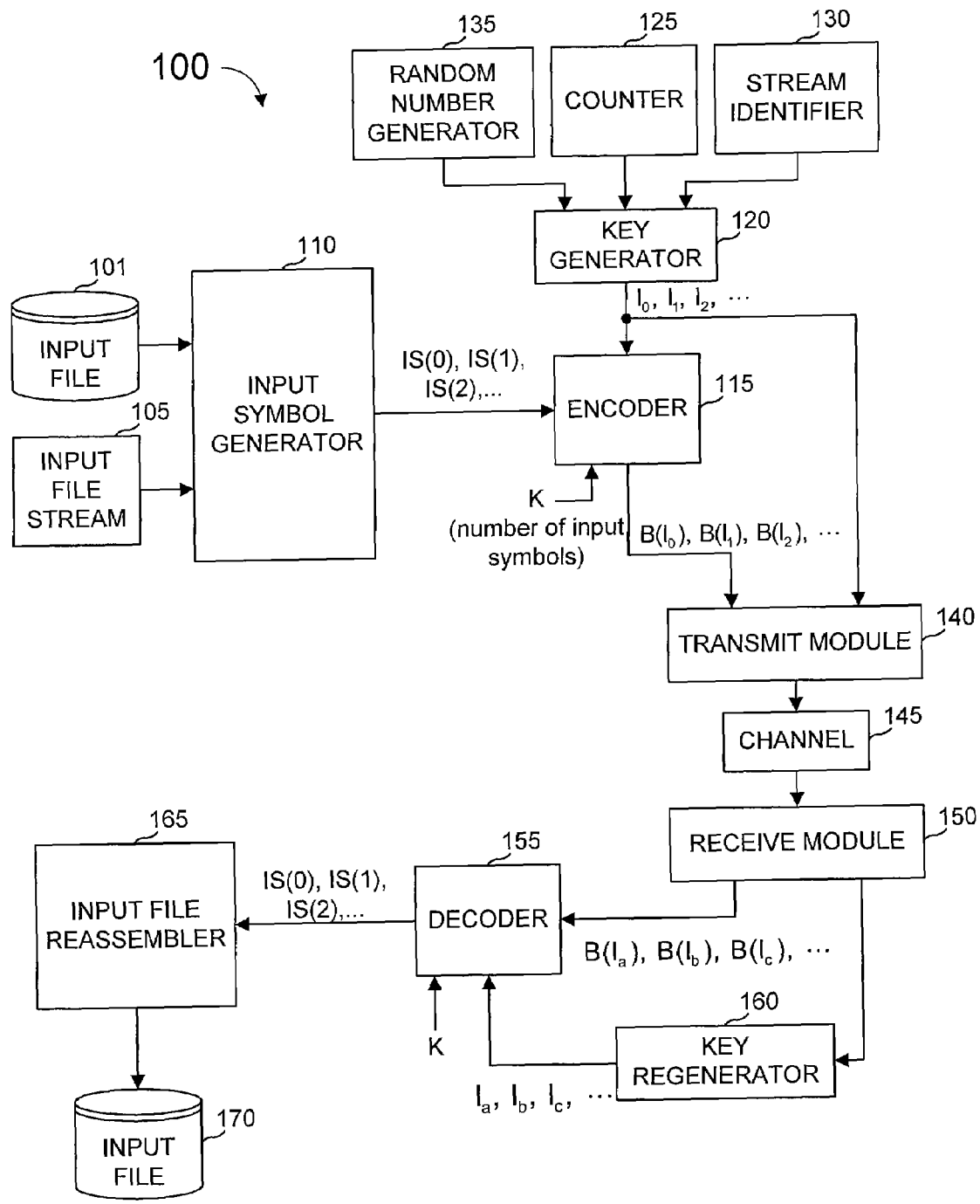
FIG. 1 is a block diagram of a communications system according to one embodiment of the present invention.

Appendix A is a source code listing of a program for implementing a weight distribution.

DESCRIPTION OF THE PREFERRED EMBODIMENTS

In the examples described herein, a coding scheme denoted as "chain reaction coding" is described, preceded by an explanation of the meaning and scope of various terms used in this description.

With chain reaction coding, output symbols are generated by the sender from the input file as needed. Each output symbol can be generated without regard to how other output symbols are generated. At any point in time, the sender can stop generating output symbols and there need not be any constraint as to when the sender stops or resumes generating output symbols. Once generated, these symbols can then be placed into packets and transmitted to their destination, with each packet containing one or more output symbols.

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of input symbols, where each input symbol has a position in the file and a value.

Transmission is the process of transmitting data from one or more senders to one or more recipients through a channel in order to deliver a file. If one sender is connected to any number of recipients by a perfect channel, the received data can be an exact copy of the input file, as all the data will be received correctly. Here, we assume that the channel is not perfect, which is the case for most real-world channels, or we assume that the data emanates from more than one sender, which is the case for some systems. Of the many channel imperfections, two imperfections of interest are data erasure and data incompleteness (which can be treated as a special case of data erasure). Data erasure occurs when the channel loses or drops data. Data incompleteness occurs when a recipient doesn't start receiving data until some of the data has already passed it by, the recipient stops receiving data before transmission ends, or the recipient intermittently stops and starts again receiving data. As an example of data incompleteness, a moving satellite sender might be transmitting data representing an input file and start the transmission before a recipient is in range. Once the recipient is in range, data can be received until the satellite moves out of range, at which point the recipient can redirect its satellite dish (during which time it is not receiving data) to start receiving the data about the same input file being transmitted by another satellite that has moved into range. As should be apparent from reading this description, data incompleteness is a special case of data erasure, since the recipient can treat the data incompleteness (and the recipient has the same problems) as if the recipient was in range the entire time, but the channel lost all the data up to the point where the recipient started receiving data. Also, as is well known in the communication systems design, detectable errors can be the equivalent of erasures by simply dropping all data blocks or symbols that have detectable errors.

In some communication systems, a recipient receives data generated by multiple senders, or by one sender using multiple connections. For example, to speed up a download, a recipient might simultaneously connect to more than one sender to transmit data concerning the same file. As another example, in a multicast transmission, multiple multicast data streams might be transmitted to allow recipients to connect to one or more of these streams to match the aggregate transmission rate with the bandwidth of the channel connecting them to the sender. In all such cases, a concern is to ensure that all transmitted data is of independent use to a recipient, i.e., that the multiple source data is not redundant among the streams, even when the transmission rates are vastly different for the different streams, and when there are arbitrary patterns of loss.

In general, transmission is the act of moving data from a sender to a recipient over a channel connecting the sender and recipient. The channel could be a real-time channel, where the channel moves data from the sender to the recipient as the channel gets the data, or the channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the channel.

When the sender and recipient are separated by a data erasure channel, it is preferable not to transmit an exact copy of an input file, but instead to transmit data generated from the input file that assists with recovery of erasures. An encoder is a circuit, device, module or code segment that handles that task. One way of viewing the operation of the encoder is that the encoder generates output symbols from input symbols, where a sequence of input symbol values represent the input file. Each input symbol would thus have a position, in the input file, and a value. A decoder is a circuit, device, module or code segment that reconstructs the input symbols from the output symbols received by the recipient.

Chain reaction coding is not limited to any particular type of input symbol, but the type of input symbol is often dictated by the application. Typically, the values for the input symbols are selected from an alphabet of $2^M$ symbols for some positive integer M. In such cases, an input symbol can be represented by a sequence of M bits of data from the input file. The value of M is often determined based on the uses of the application and on the channel. For example, for a packet-based Internet channel, a packet with a payload of size of 1024 bytes might be appropriate (a byte is 8 bits). In this example, assuming each packet contains one output symbol and 8 bytes of auxiliary information, an input symbol size of M=(1024−8)·8, or 8128 bits would be appropriate. As another example, some satellite systems use the MPEG packet standard, where the payload of each packet comprises 188 bytes. In that example, assuming each packet contains one output symbol and 4 bytes of auxiliary information, a symbol size of M=(188−4)·8, or 1472 bits would be appropriate. In a general-purpose communication system using chain reaction coding, the application-specific parameters, such as the input symbol size (i.e., M, the number of bits encoded by an input symbol), might be variables set by the application.

Each output symbol has a value. In one preferred embodiment, which we consider below, each output symbol has an identifier called its "key." Preferably, the key of each output symbol can be easily determined by the recipient to allow the recipient to distinguish one output symbol from other output symbols. Preferably, the key of an output symbol is distinct from the keys of all other output symbols. Also preferably, as little data as possible is included in the transmission in order for a recipient to determine the key of a received output symbol.

In a simple form of keying, the sequence of keys for consecutive output symbols generated by an encoder is a sequence of consecutive integers. In this case, each key is called a "sequence number". In the case where there is one output symbol value in each transmitted packet, the sequence number can be included in the packet. Since sequence numbers can typically fit into a small number of bytes, e.g., 4 bytes, including the sequence number along with the output symbol value in some systems is economical. For example, using UDP Internet packets of 1024 bytes each, allocating 4 bytes in each packet for the sequence number incurs only a small overhead of 0.4%.

In other systems, it is preferable to form a key from more than one piece of data. For example, consider a system that includes a recipient receiving more than one data stream generated from the same input file from one or more senders, where the transmitted data is a stream of packets, each containing one output symbol. If all such streams use the same set of sequence numbers as keys, then it is likely that the recipient will receive output symbols with the same sequence numbers. Since output symbols with the same key, or in this case with the same sequence number, contain identical information about the input file, this causes useless reception of duplicate data by the recipient. Thus, in such a situation it is preferred that the key comprise a unique stream identifier paired with a sequence number.

For example, for a stream of UDP Internet packets, the unique identifier of a data stream could include the IP address of the sender and the port number that the sender is using to transmit the packets. Since the IP address of the sender and the port number of the stream are parts of the header of each UDP packet, there is no additional space required in each packet to ensure that these parts of the key are available to a recipient. The sender need only insert a sequence number into each packet together with the corresponding output symbol, and the recipient can recreate the entire key of a received output symbol from the sequence number and from the packet header. As another example, for a stream of IP multicast packets the unique identifier of a data stream could include the IP multicast address. Since the IP multicast address is part of the header of each IP multicast packet, the remarks made above about UDP packets apply to this situation as well.

Keying by the position of the output symbol is preferred when it is possible. Position keying might work well for reading output symbols from a storage device, such as a CD-ROM (Compact Disk Read-Only-Memory), where the key of an output symbol is its position on the CD-ROM (i.e., track, plus sector, plus location within the sector, etc.). Position keying might also work well for a circuit based transmission system, such as an ATM (Asynchronous Transfer Mode) system, where ordered cells of data are transmitted under tight timing constraints. With this form of keying, the recipient can recreate the key of an output symbol with no space required for explicitly transmitting the key. Position keying, of course, requires that such position information be available and reliable.

Keying by position might also be combined with other keying methods. For example, consider a packet transmission system where each packet contains more than one output symbol. In this case, the key of the output symbol might be constructed from a unique stream identifier, a sequence number, and the position of the output symbol within the packet. Since data erasures generally result in the loss of entire packets, the recipient generally receives a full packet. In this case, the recipient can recreate the key of an output symbol from the header of the packet (which contains a unique stream identifier), the sequence number in the packet, and the position of the output symbol within the packet.

Another form of keying that is preferred in some systems is random keying. In these systems, a random (or pseudo-random) number is generated, used as the key for each output symbol and explicitly transmitted with the output symbol. One property of random keying is that the fraction of keys that have the same value is likely to be small, even for keys generated by different senders at different physical locations (assuming the range of possible keys is large enough). This form of keying may have the advantage over other forms in some systems because of the simplicity of its implementation.

As explained above, chain reaction coding is useful where there is an expectation of data erasure or where the recipient does not begin and end reception exactly when a transmission begins and ends. The latter condition is referred to herein as "data incompleteness". These conditions do not adversely affect the communication process when chain reaction coding is used, because the chain reaction coding data that is received is highly independent so that it is information additive. If most random collections of output symbols are independent enough to be largely information additive, which is the case for the chain reaction coding systems described herein, then any suitable number of packets can be used to recover an input file. If a hundred packets are lost due to a burst of noise causing data erasure, an extra hundred packets can be picked up after the burst to replace the loss of the erased packets. If thousands of packets are lost because a receiver did not tune into a transmitter when it began transmitting, the receiver could just pickup those thousands of packets from any other period of transmission, or even from another transmitter. With chain reaction coding, a receiver is not constrained to pickup any particular set of packets, so it can receive some packets from one transmitter, switch to another transmitter, lose some packets, miss the beginning or end of a given transmission and still recover an input file. The ability to join and leave a transmission without receiver-transmitter coordination greatly simplifies the communication process.

A Basic Implementation

Transmitting a file using chain reaction coding involves generating, forming or extracting input symbols from an input file, encoding those input symbols into one or more output symbols, where each output symbol is generated based on its key independently of all other output symbols, and transmitting the output symbols to one or more recipients over a channel. Receiving (and reconstructing) a copy of the input file using chain reaction coding involves receiving some set or subset of output symbols from one of more data streams, and decoding the input symbols from the values and keys of the received output symbols.

As will be explained, the decoder can recover an input symbol from the values of one or more output symbols and possibly from information about the values of other input symbols that have already been recovered. Thus, the decoder can recover some input symbols from some output symbols, which in turn allows the decoder to decode other input symbols from those decoded input symbols and previously received output symbols, and so on, thus causing a "chain reaction" of recovery of input symbols of a file being reconstructed at the recipient.

Aspects of the invention will now be described with reference to the figures.

FIG. 1 is a block diagram of a communications system 100 that uses chain reaction coding. In communications system 100, an input file 101, or an input stream 105, is provided to an input symbol generator 110. Input symbol generator 110 generates a sequence of one or more input symbols (IS(0), IS(1), IS(2), . . . ) from the input file or stream, with each input symbol having a value and a position (denoted in FIG. 1 as a parenthesized integer). As explained above, the possible values for input symbols, i.e., its alphabet, is typically an alphabet of $2^M$ symbols, so that each input symbol codes for M bits of the input file. The value of M is generally determined by the use of communication system 100, but a general purpose system might include a symbol size input for input symbol generator 110 so that M can be varied from use to use. The output of input symbol generator 110 is provided to an encoder 115.

Key generator 120 generates a key for each output symbol to be generated by the encoder 115. Each key is generated according to one of the methods described previously, or any comparable method that insures that a large fraction of the keys generated for the same input file are unique, whether they are generated by this or another key generator. For example, key generator 120 may use a combination of the output of a counter 125, a unique stream identifier 130, and/or the output of a random generator 135 to produce each key. The output of key generator 120 is provided to encoder 115.

From each key I provided by key generator 120, encoder 115 generates an output symbol, with a value B(I), from the input symbols provided by the input symbol generator. The value of each output symbol is generated based on its key and on some function of one or more of the input symbols, referred to herein as the output symbol's "associated input symbols" or just its "associates". The selection of the function (the "value function") and the associates is done according to a process described in more detail below. Typically, but not always, M is the same for input symbols and output symbols, i.e., they both code for the same number of bits.

In some embodiments, the number K of input symbols is used by the encoder to select the associates. If K is not known in advance, such as where the input is a streaming file, K can be just an estimate. The value K might also be used by encoder 115 to allocate storage for input symbols.

Encoder 115 provides output symbols to a transmit module 140. Transmit module 140 is also provided the key of each such output symbol from the key generator 120. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoder 115 and decoder 155.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a decoder 155, and any data receive module 150 receives about the keys of these output symbols is provided to a key regenerator 160. Key regenerator 160 regenerates the keys for the received output symbols and provides these keys to decoder 155. Decoder 155 uses the keys provided by key regenerator 160 together with the corresponding output symbols, to recover the input symbols (again IS(0), IS(1), IS(2), . . . ). Decoder 155 provides the recovered input symbols to an input file reassembler 165, which generates a copy 170 of input file 101 or input stream 105.

A Basic Encoder

Figure 2:
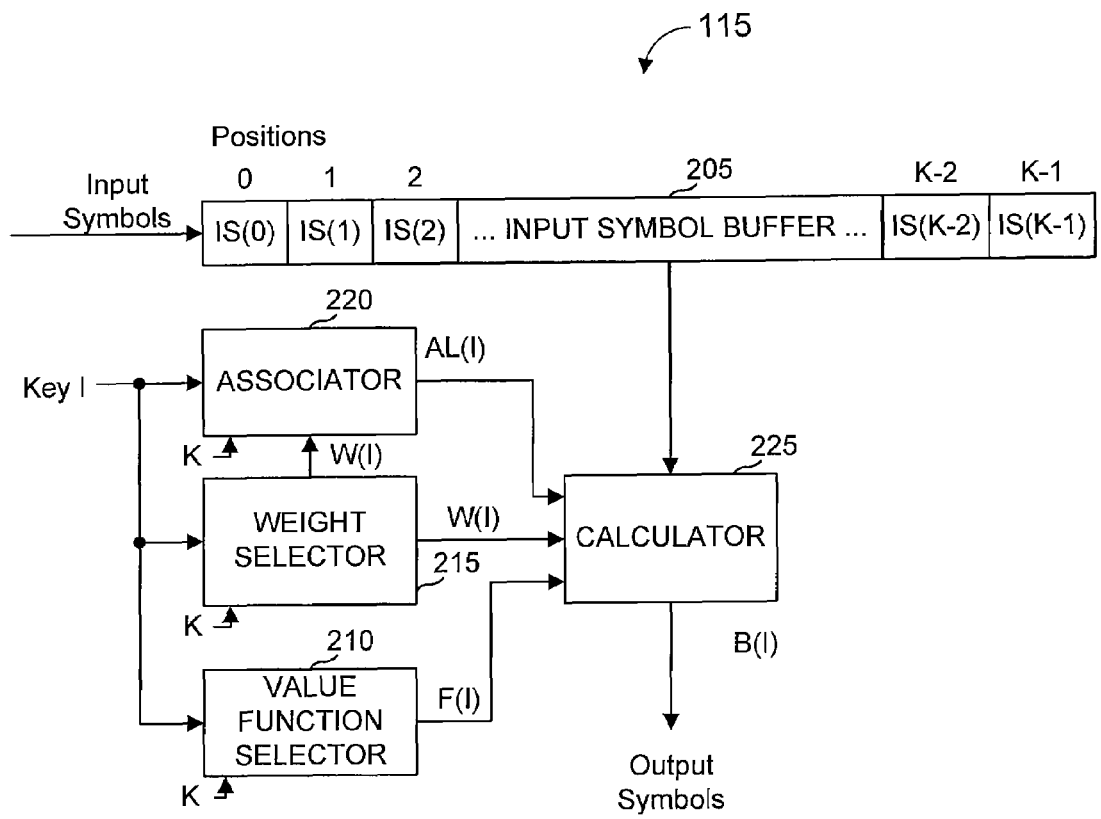
FIG. 2 is a block diagram showing the encoder of FIG. 1 is greater detail.
Figure 3:
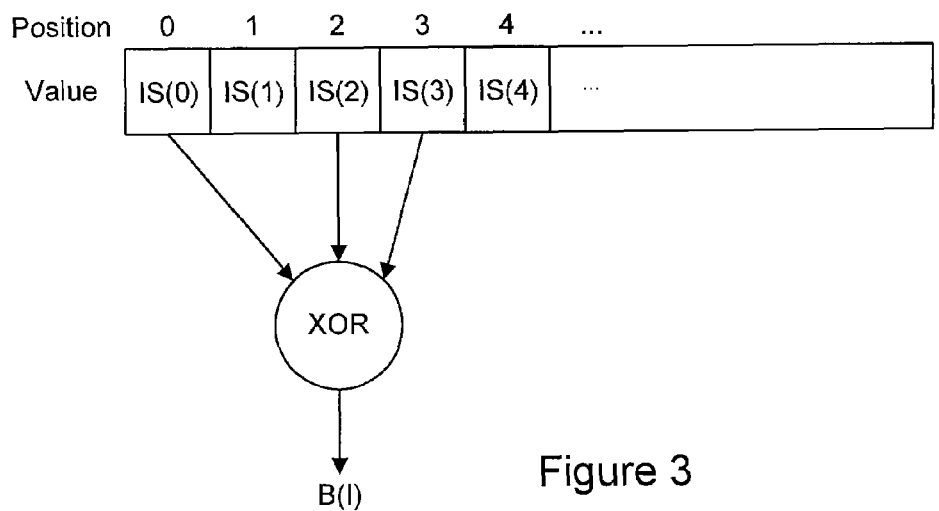
FIG. 3 is an illustration of how an output symbol might be generated from a set of associated input symbols.

FIG. 2 is a block diagram of one embodiment of encoder 115 shown in FIG. 1. The block diagram of FIG. 2 is explained herein with references to FIG. 3, which is a diagram showing the logical equivalent of some of the processing performed by the encoder shown in FIG. 2.

Encoder 115 is provided with input symbols and a key for each output symbol it is to generate. As shown, the K input symbols are stored in an input symbol buffer 205. Key I (provided by the key generator 120 shown in FIG. 1) is an input to value function selector 210, weight selector 215 and associator 220. The number of input symbols K is also provided to these three components, 210, 215 and 220. A calculator 225 is coupled to receive outputs from value function selector 210, weight selector 215, associator 220 and the input symbol buffer 205, and has an output for output symbol values. It should be understood that other equivalent arrangements to the elements shown in FIG. 2 might be used, and that this is but one example of an encoder according to the present invention.

In operation, the K input symbols are received and stored in input symbol buffer 205. As explained above, each input symbol has a position (i.e., its original position in the input file) and a value. The input symbols need not be stored in input symbol buffer 205 in their respective order, so long as the position of stored input symbols can be determined.

Using key I and the number of input symbols K, weight selector 215 determines the number W(I) of input symbols that are to be "associates" of the output symbol having key I. Using key I, weight W(I) and the number of input symbols K, associator 220 determines the list AL(I) of positions of input symbols associated with the output symbol. It should be understood that W(I) need not be separately or explicitly calculated if associator 220 can generate AL(I) without knowing W(I) ahead of time. Once AL(I) is generated, W(I) can be easily determined because it is the number of associates in AL(I).

Once I, W(I) and AL(I) are known, the value B(I) of the output symbol is calculated by calculator 225 based on a value function F(I). One property of a suitable value function is that it would allow the value for an associate in AL(I) to be determined from output symbol value B(I) and from the values for the other W(I)−1 associates in AL(I). One preferred value function used in this step is the XOR value function, since it satisfies this property, is easily computed and easily inverted. However, other suitable value functions might be used instead.

If used, value function selector 210 determines a value function F(I) from key I and from K. In one variation, the value function F(I) is the same value function F for all I. In that variation, value function selector 210 is not needed and calculator 225 can be configured with the value function F. For example, the value function might be XOR for all I, i.e., the output symbol value is an XOR (exclusive OR) of the values of all of its associates.

For each key I, weight selector 215 determines a weight W(I) from I and K. In one variation, weight selector 215 selects W(I) by using the key I to first generate a random looking number and then uses this number to look up the value of W(I) in a distribution table that is stored within weight selector 215. A more detailed description of how such a distribution table might be formed and accessed is given below. Once weight selector 215 determines W(I), this value is provided to associator 220 and to calculator 225.

Associator 220 determines a list AL(I) of the positions of the W(I) input symbols associated with the current output symbol. The association is based on the value of I, on the value of W(I) and on K (if available). Once associator 220 determines AL(I), AL(I) is provided to calculator 225. Using list AL(I), weight W(I) and either the value function F(I) provided by value function selector 210 or a preselected value function F, calculator 225 accesses the W(I) input symbols referenced by AL(I) in input symbol buffer 205 to calculate the value, B(I), for the current output symbol. An example of a procedure for calculating AL(I) is given below, but another suitable procedure might be used instead. Preferably, the procedure gives each input symbol a roughly even chance of being selected as an associate for a given output symbol and does the selection in a way that the decoder can replicate if the decoder does not already have AL(I) available to it.

Encoder 115 then outputs B(I). In effect, encoder 115 performs the action illustrated in FIG. 3, namely, to generate an output symbol value B(I) as some value function of selected input symbols. In the example shown, the value function is XOR, the weight W(I) of the output symbol is 3, and the associated input symbols (the associates) are at positions 0, 2, and 3 and have respective values IS(0), IS(2) and IS(3). Thus, the output symbol is calculated as:

$$B(I)=IS(0) \text{ XOR } IS(2) \text{ XOR } IS(3)$$

for that value of I.

The generated output symbols are then transmitted and received as described above. Herein, it is assumed that some of the output symbols might have been lost or gotten out of order, or were generated by one or more encoders. It is assumed, however, that the output symbols that are received have been received with an indication of their key and some assurance their values B(I) are accurate. As shown in FIG. 1, those received output symbols, together with their corresponding keys reconstructed from their indication by key regenerator 160 and the value of K, are the input to decoder 155.

The number of bits, M, encoded in an input symbol (i.e., its size) is dependent on the application. The size of an output symbol is also dependent on the application, but might also be dependent on the channel. For example, if the typical input file is a multiple megabyte file, the input file might be broken into thousands, tens of thousands, or hundreds of thousands of input symbols with each input symbol encoding a few, tens, hundreds or thousands of bytes.

In some cases, the coding process might be simplified if the output symbol values and the input symbol values were the same size (i.e., representable by the same number of bits or selected from the same alphabet). If that is the case, then the input symbol value size is limited when the output symbol value size is limited, such as when it is desired to put output symbols in packets and each output symbol must fit into a packet of limited size. If some data about the key were to be transmitted in order to recover the key at the receiver, the output symbol would preferably be small enough to accommodate the value and the data about the key in one packet.

As described above, although the positions of the input symbols are typically consecutive, in many implementations, the keys are far from consecutive. For example, if an input file were divided up into 60,000 input symbols, the positions for the input symbols would range from 0 to 59,999, while in one of the implementations mentioned previously, each key might be independently chosen as a random 32-bit number and the output symbols might be generated continuously and transmitted until the sender is stopped. As shown herein, chain reaction coding allows the 60,000 symbol input file to be reconstructed from any sufficiently large collection (60,000+ some increment A) of output symbols regardless of where in the output sequence those output symbols where taken.

A Basic Decoder

Figure 4:
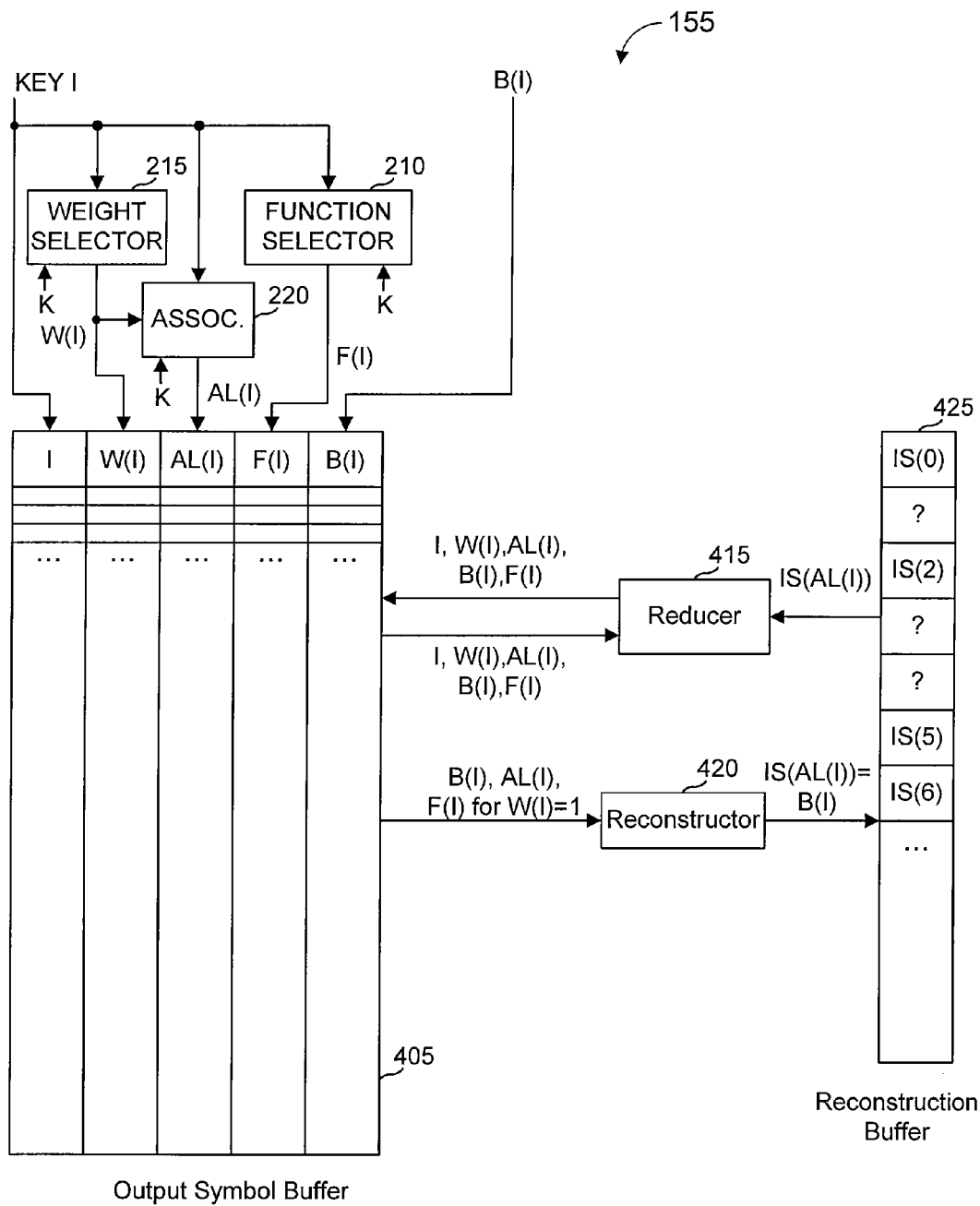
FIG. 4 is a block diagram of a basic decoder as might be used in the communications system shown in FIG. 1.

FIG. 4 shows one embodiment of decoder 155 in detail, with many parts in common with encoder 115 shown in FIG. 2. Decoder 155 comprises a value function selector 210, a weight selector 215, an associator 220, an output symbol buffer 405, a reducer 415, a reconstructor 420 and a reconstruction buffer 425. As with the encoder, value function selector 210 and the space in output symbol buffer 405 allocated for storing the description of the value function is optional and might not be used if the value function was the same for all output symbols. Several entries of reconstruction buffer 425 are shown, with some input symbols reconstructed and with others as yet unknown. For example, in FIG. 4, the input symbols at positions 0, 2, 5 and 6 have been recovered and the input symbols at positions 1, 3 and 4 have yet to be recovered.

Figure 5:
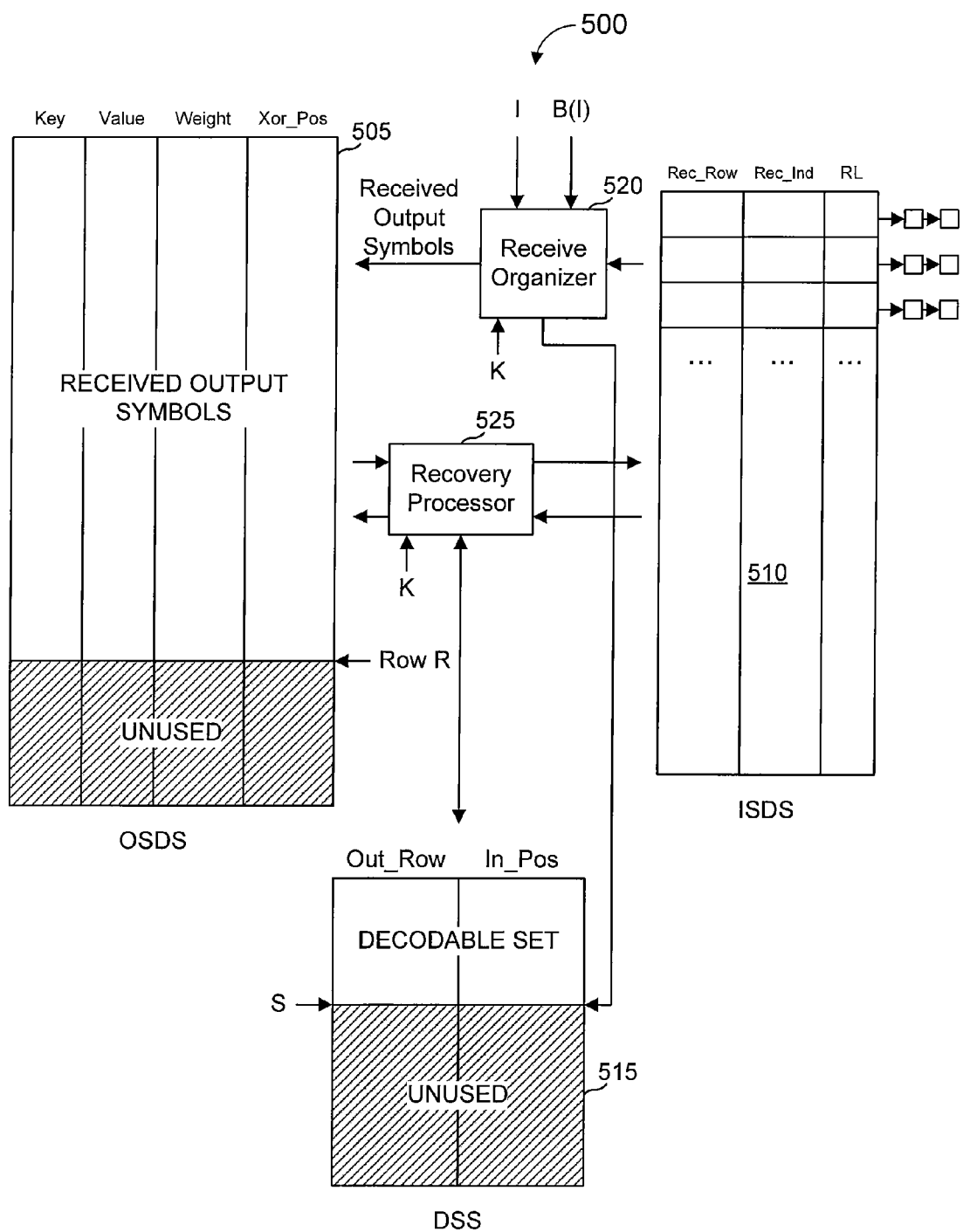
FIG. 5 is a block diagram of an alternative decoder.

In operation, for each received output symbol with key I and value B(I), decoder 155 does the following. Key I is provided to value function selector 210, weight selector 215 and associator 220. Using K and key I, weight selector 215 determines weight W(I). Using K, key I and W(I), associator 220 produces the list AL(I) of W(I) positions of input symbols associated with the output symbol. Optionally, using K and I, value function selector 210 selects value function F(I). Then, I, B(I), W(I) and AL(I), and optionally F(I), are stored in a row of output symbol buffer 405. Value function selector 210, weight selector 215 and associator 220 perform the same operation for decoder 155 as described for encoder 115. In particular, the value function F(I), the weight W(I) and the list AL(I) produced by value function selector 210, by weight selector 215 and by associator 220 in FIG. 5 are the same for the same key I as for the corresponding parts shown in FIG. 4. If K varies from input file to input file, it can be communicated from the encoder to the decoder in any conventional manner, such as including it in a message header.

Reconstructor 420 scans output symbol buffer 405 looking for output symbols stored there that have weight one, i.e., W(I)=1 and AL(I) lists the position of just one associate. Those symbols are referred to herein as members of a "decodable set." For value functions with the properties described above, output symbols of weight one are in the decodable set because a value of an input symbol can be determined from that output symbol. Of course, if a value function were used that would allow input symbols to be decoded under a condition other than having a weight of one, that condition would be used to determine whether an output symbol is in the decodable set. For clarity, the examples described here assume that the decodable set is those output symbols with weight one, and extensions of these examples to other value function decodable conditions should be apparent from this description.

When reconstructor 420 finds an output symbol that is in the decodable set, the output symbol's value B(I) and optionally the value function F(I) is used to reconstruct the input symbol listed in AL(I) and the reconstructed input symbol is placed into reconstruction buffer 425 at the appropriate position for that input symbol. If the indicated input symbol had already been reconstructed, the reconstructor 420 could drop the newly reconstructed input symbol, overwrite the existing reconstructed input symbol, or compare the two and issue an error if they differ. Where the value function is an XOR of all the associates, the input symbol value is simply the output symbol's value. Reconstructor 420 thus reconstructs input symbols, but only from output symbols in the decodable set. Once an output symbol from the decodable set is used to reconstruct an input symbol it can be deleted to save space in output symbol buffer 405. Deleting the "used up" output symbol also ensures that reconstructor 420 does not continually revisit that output symbol.

Initially, reconstructor 420 waits until at least one output symbol is received that is a member of the decodable set. Once that one output symbol is used, the decodable set would be empty again, except for the fact that some other output symbol might be a function of only that one reconstructed input symbol and one other input symbol. Thus, reconstructing one input symbol from a member of the decodable set might cause other output symbols to be added to the decodable set. The process of reduction of output symbols to add them to the decodable set is performed by reducer 415.

Reducer 415 scans output symbol buffer 405 and reconstruction buffer 425 to find output symbols that have lists AL(I) that list positions of input symbols that have been recovered. When reducer 415 finds such a "reducible" output symbol with key I, reducer 415 obtains the value IS(R) of a recovered input symbol at position R and modifies B(I), W(I) and AL(I) as follows:

B(I) is reset to B(I) XOR IS(R)

W(I) is reset to W(I)−1

AL(I) is reset to AL(I) excluding R

In the equations above, it is assumed that the value function was an XOR of all the associates' values. Note that XOR is its own inverse—if that were not the case and another value function was used originally to compute the output symbol, then the inverse of that value function would be used here by reducer 415. As should be apparent, if the values for more than one associate are known, the equivalent of the above equations can be calculated to make B(I) dependent only on any unknown associate values (and adjust W(I) and L(I) accordingly).

The action of reducer 415 reduces the weights of output symbols in output symbol buffer 405. When an output symbol's weight is reduced to one (or other decodable condition occurs for other value functions), then that output symbol becomes a member of the decodable set, which can then be acted upon by reconstructor 420. In practice, once a sufficient number of output symbols are received, reducer 415 and reconstructor 420 create a chain reaction decoding, with reconstructor 420 decoding the decodable set to recover more input symbols, reducer 415 using those freshly recovered input symbols to reduce more output symbols so they are added to the decodable set, and so on, until all input symbols from the input file are recovered.

The decoder shown in FIG. 4 reconstructs input symbols in a straightforward manner, without much consideration to memory storage, computation cycles or transmission time. Where the decoder memory, decoding time or transmission time (which constrains the number of output symbols that are received) are limited, the decoder can be optimized to better use those limited resources.

A More Efficient Decoder

FIG. 5 shows a preferred embodiment of a more efficient implementation of a decoder 500 in detail. Here, the value function is assumed to be XOR. Similar implementations apply with respect to value functions other than XOR. Referring to FIG. 5, decoder 500 comprises output symbol data structure 505 (hereafter referred to as OSDS 505), input symbol data structure 510 (hereafter referred to as ISDS 510), decodable set stack 515 (hereafter referred to as DSS 515), receive organizer 520, and recovery processor 525.

OSDS 505 is a table that stores information about output symbols, where row R of OSDS 505 stores information about the R-th output symbol that is received. A variable R keeps track of the number of output symbols that have been received, and it is initialized to zero. OSDS 505 stores the fields KEY, VALUE, WEIGHT and XOR_POS for each row, with the fields shown organized in columns. The KEY field stores the key of the output symbol. The VALUE field stores the output symbol value, which is updated during processing. All output symbols that are eventually used to recover an input symbol eventually have their VALUE modified to the recovered input symbol value. The WEIGHT field stores the initial weight of the output symbol. The WEIGHT of an output symbol is reduced over time until it becomes one and then can be used to recover an input symbol. The XOR_POS field initially stores the XOR of all the positions of the associates of the output symbol. When the WEIGHT of an output symbol becomes one, the XOR_POS of the output symbol becomes the position of the one remaining associate.

ISDS 510 is a table that stores information about input symbols, where row P stores information about the input symbol at position P. For each row ISDS 510 includes storage for a REC_ROW field, which eventually becomes the row number in OSDS 505 of the output symbol that is used to recover the input symbol, a REC_IND field, which is initialized to all values "no" and indicates whether or not input symbols have been recovered, and an RL field. When an input symbol is recovered, the REC_IND of the input symbol is changed to "yes". The RL column is initialized to all "empty list" values. As output symbols are received that have an input symbol as an associate, the row number in OSDS 505 of the output symbol is added to the RL list for the input symbol.

DSS 515 is a stack that stores information about the decodable set. A variable S keeps track of the size of the decodable set, and it is initialized to zero. In DSS 515, column OUT_ROW stores row numbers in OSDS 505 of output symbols, and column IN_POS stores the positions in ISDS 510 of the input symbols that can be recovered.

Figure 6:
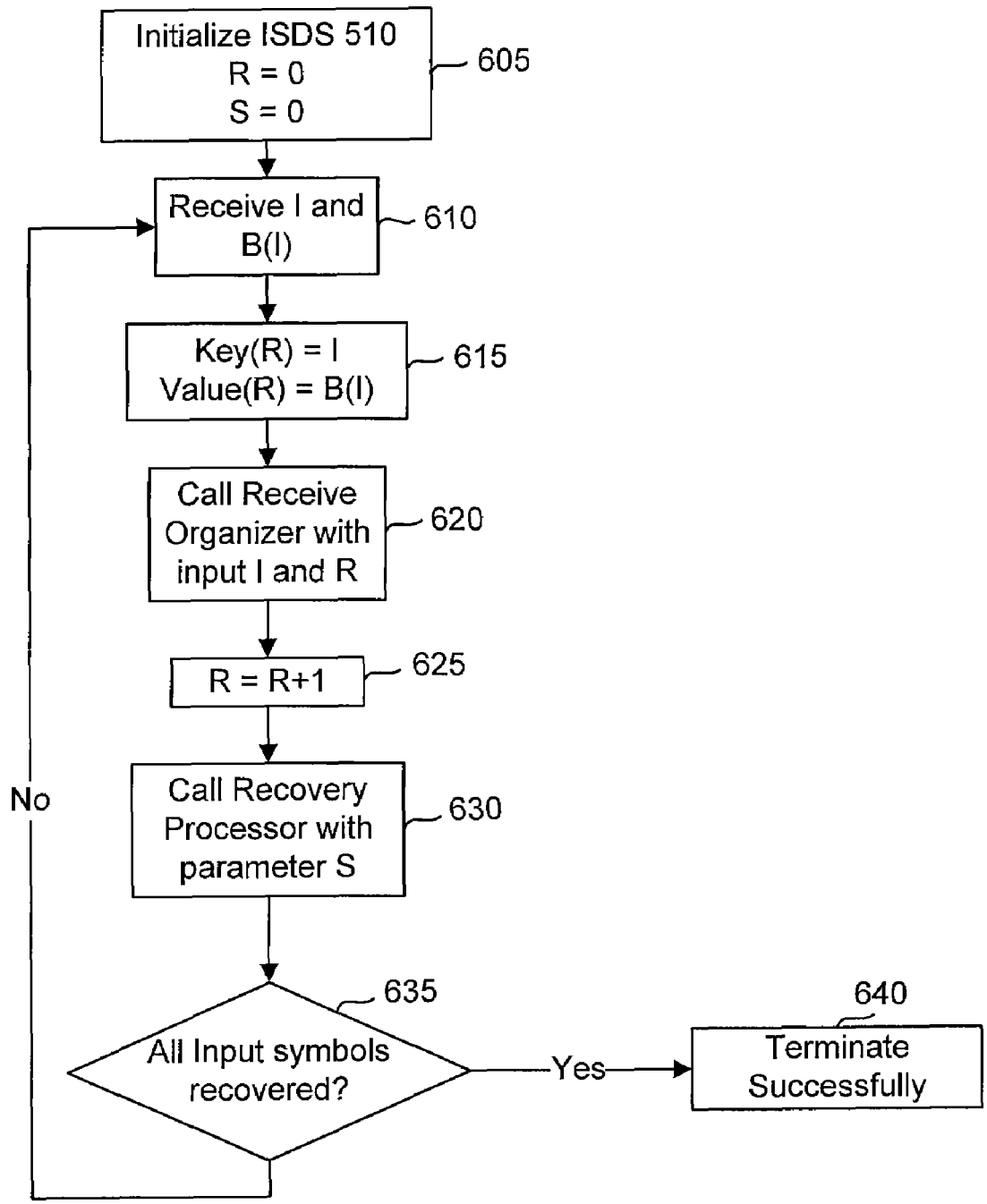
FIG. 6 is a flowchart of a process that might be used by a decoder, such as the decoder shown in FIG. 5, to recover input symbols from a set of output symbols.
Figure 7:
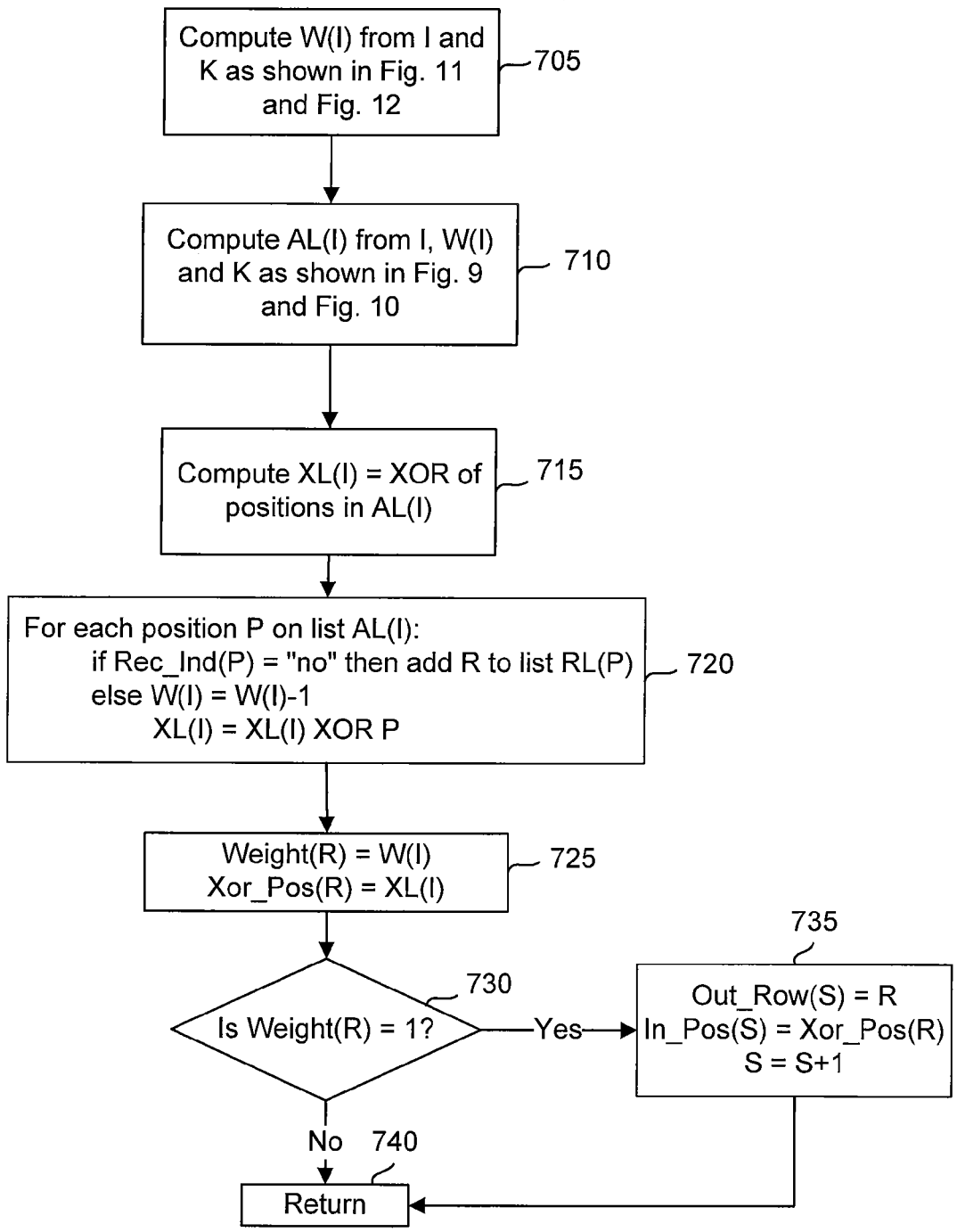
FIG. 7 is a flowchart of process that might be used by a receive organizer, such as the receive organizer shown in FIG. 5, to organize received output symbols.
Figure 8A:
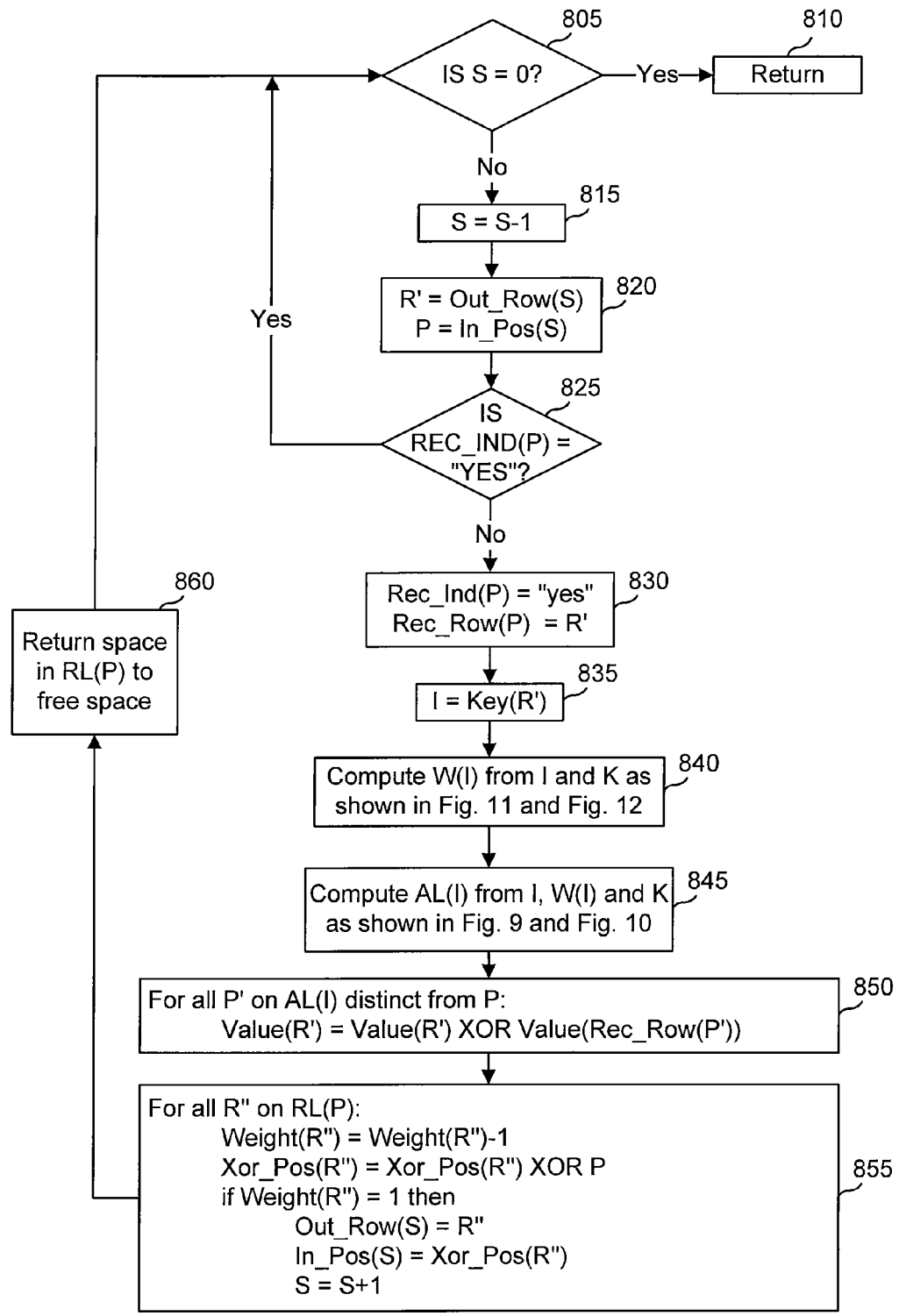
FIG. 8(a) is a flowchart of process that might be used by a recovery processor, such as the recovery processor shown in FIG. 5, to process received output symbols.
Figure 8B:
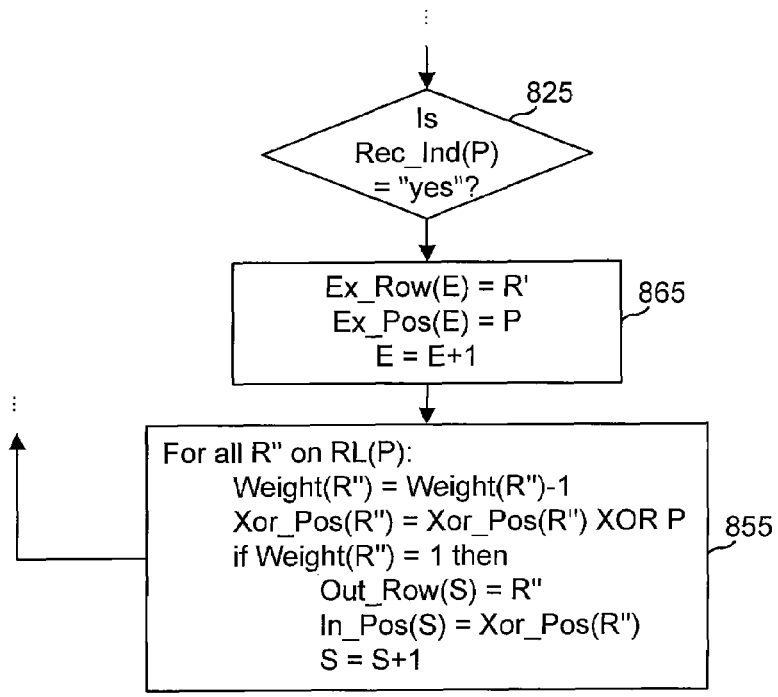
FIGS. 8(b)-(c) form a flowchart of portions of a variation of the process of FIG. 8(a), with FIG. 8(b) showing steps performed in the recovery process including deferred processing and FIG. 8(c) showing the deferred processing.
Figure 8C:
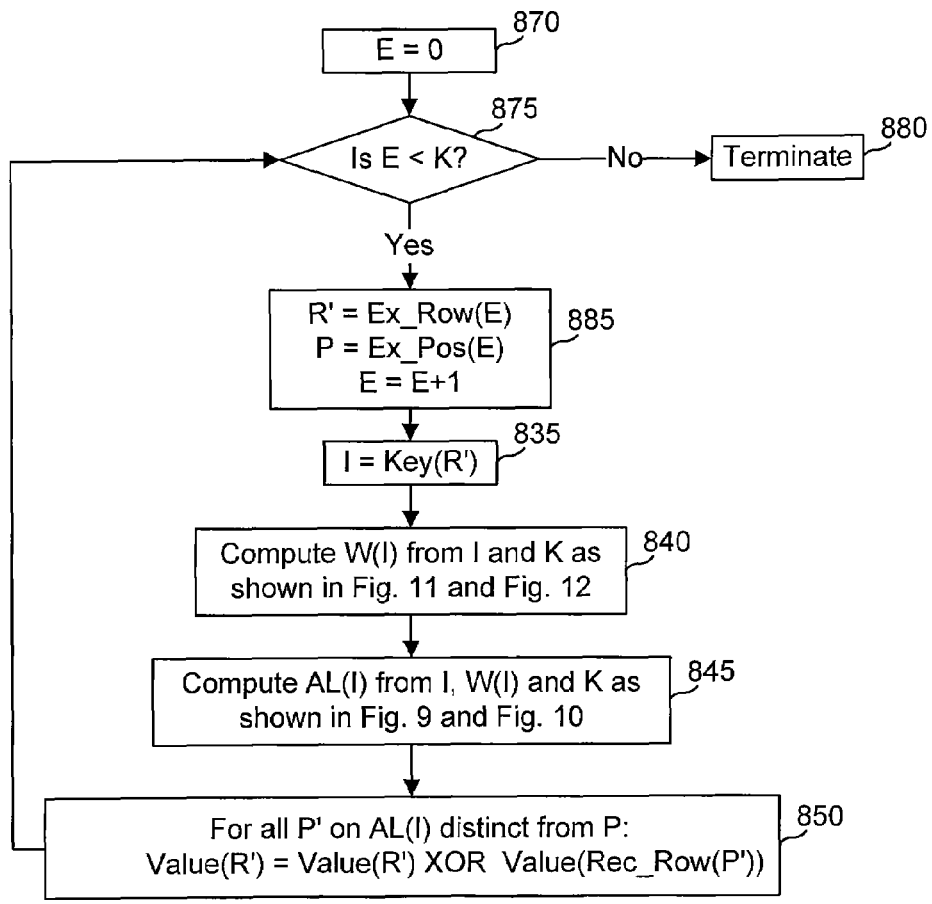

In one embodiment, decoder 500 operates as follows and as shown in the flowchart of FIG. 6 with the corresponding steps of FIG. 6 indicated parenthetically in the description of the process. First, ISDS 510 is initialized as described above, and both R and S are initialized to zero (605). When a new output symbol is received (610), i.e., the key I and the output symbol value B(I), KEY(R) is set to I and VALUE(R) is set to B(I) in OSDS 505 (615). Receive organizer 520 is then called to process the received output symbol with key I stored in row R of OSDS 505 (620). This includes adding information to OSDS 505 and DSS 515 appropriately using information stored in ISDS 510, as shown in the flowchart of FIG. 7. Then, R is incremented by one (625) to cause the next output symbol to be stored in the next row of OSDS 505. Recovery processor 525 is then called to process output symbols in the decodable set and to add new output symbols to the decodable set (630). This includes adding to and deleting from the decodable set stored in DSS 515, using and modifying portions of ISDS 510 and OSDS 505 appropriately, as shown in the flowchart of FIG. 8(*a*) and/or 8(*b*). Decoder 500 keeps track of the number of input symbols that have been recovered, and when this number reaches K, i.e., all input symbols have been recovered, decoder 500 terminates successfully, otherwise it returns to step 610 to receive the next output symbol, as shown in 635 and 640.

Figure 9:
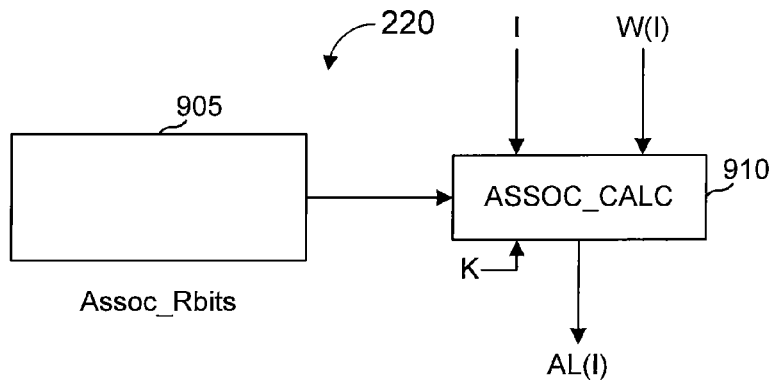
FIG. 9 is a block diagram showing the associator of FIG. 2 in greater detail.
Figure 10:
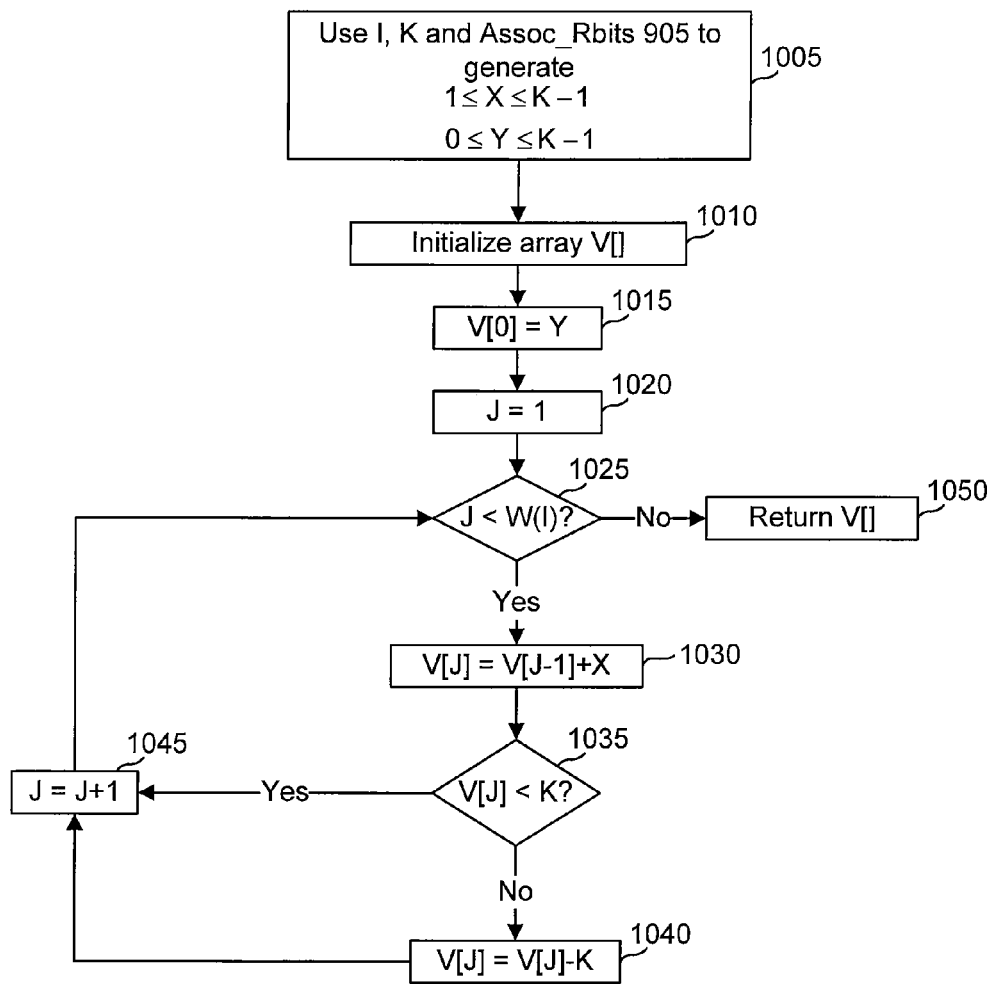
FIG. 10 is a flowchart of one process that might be used by an associator, such as the associator shown in FIG. 9, to quickly determine the association of input symbols with output symbols.
Figure 11:
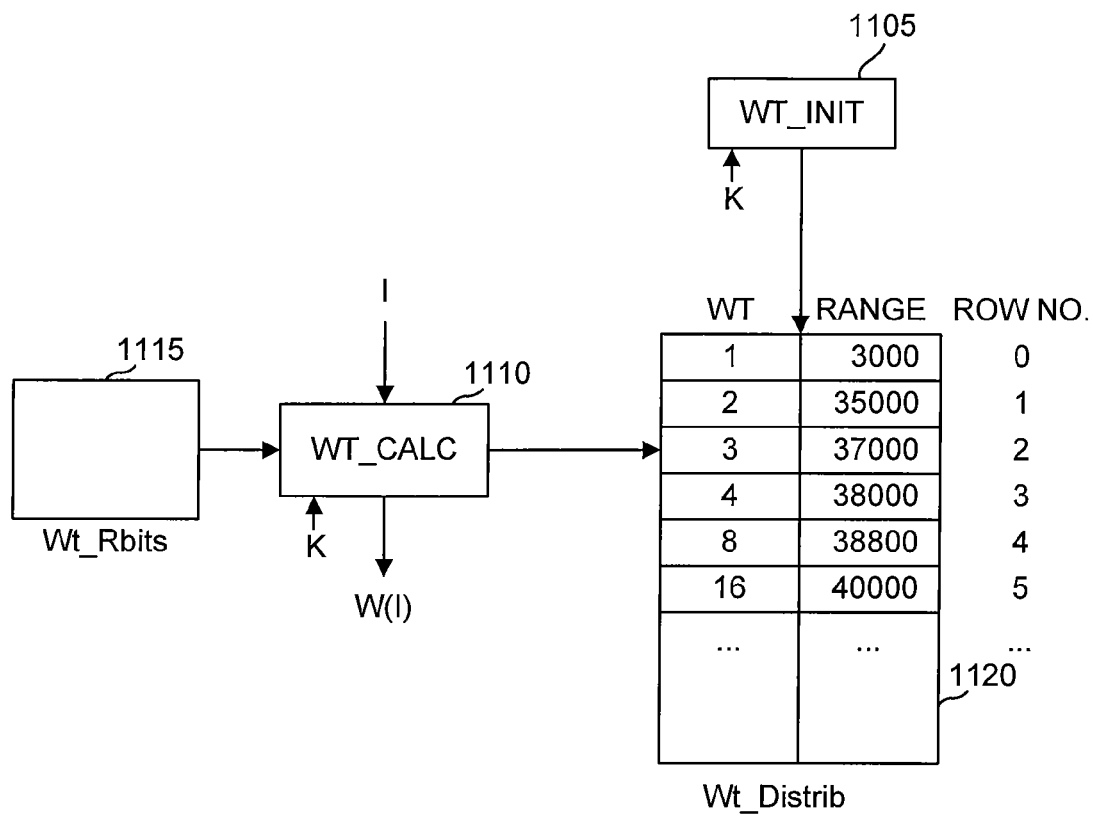
FIG. 11 is a block diagram showing the weight selector of FIG. 2 in greater detail.
Figure 12:
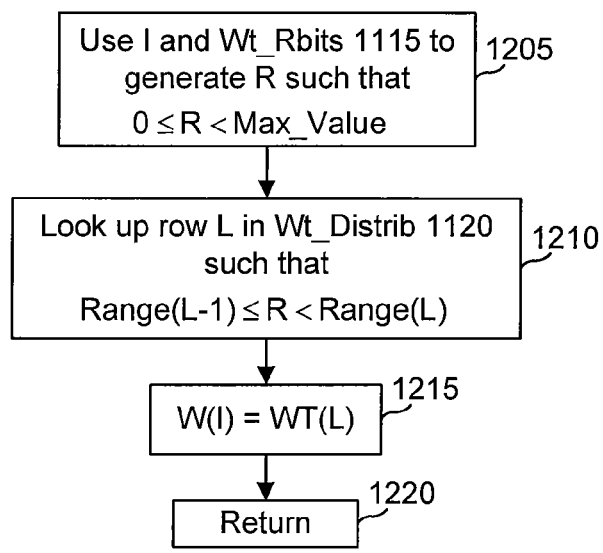
FIG. 12 is a flowchart of a process that might be used by a weight selector, such as the weight selector shown in FIG. 11, to determine a weight for a given output symbol.

A flowchart that describes the operation of receive organizer 520 is shown in FIG. 7, which refers to FIGS. 9-12. When an output symbol with value B(I) and key I arrives, receive organizer 520 performs the following operations, referring to FIG. 7. Weight W(I) is computed from I and K (705) and list AL(I) of positions of associates is computed from I, W(I), and K (710). FIGS. 11-12 show the details of one computation of W(I) and FIGS. 9-10 show the details of one computation of AL(I).

Referring again to FIG. 7, the value of XL(I) is computed as the XOR of all of the positions in AL(I) (715). Then, for each position P on list AL(I), if input symbol P is not recovered, i.e., if REC_IND(P)="no" in ISDS 510, then R is added to list RL(P) in ISDS 510, otherwise if input symbol P is recovered, i.e., if REC_IND(P)="yes" in ISDS 510, then W(I) is decremented by one and XL(I) is reset to XL(I) XOR P (720). Then, XOR_POS(R) is set to XL(I) and WEIGHT(R) is set to W(I) in OSDS 505 (725). WEIGHT(R) is then compared to one (730). If WEIGHT(R) is equal to one, then the output symbol is added to the decodable set, i.e., OUT_ROW(S) is set to R and IN_POS(S) is set to XOR_POS(R) in DSS 515 and the value of S is incremented by one (735). Finally, receive organizer 520 returns (740).

A flowchart that describes one operation of recovery processor 525 is shown in FIG. 8(*a*), which refers to FIGS. 9-12. In that operation, recovery processor 525 first checks to see if the decodable set is empty, i.e., if S=0, and if so it immediately returns (805, 810). If the decodable set is not empty, then S is decremented by one (815) and the row number R' of the output symbol and the position P of the associated input symbol is loaded from DSS 515 (820). If the input symbol at position P has already been recovered, i.e., if REC_IND (P)="yes," (825), then recovery processor 525 stops processing this element of the decodable set and continues on to process the next. Otherwise, the output symbol stored at row number R' in OSDS 505 is used to recover the input symbol at position P in ISDS 510, and this is indicated by setting REC_IND(P) to "yes" and REC_ROW(P) to R' in ISDS 510 (830). Then, the original key of the output symbol, KEY(R') from OSDS 505, is loaded into I (835) in order to compute the original weight W(I) and the original list of associates AL(I) of the key (840, 845).

Referring still to FIG. 8(*a*), the recovered value of the input symbol at position P is computed as the XOR of the output symbol and all associates of the output symbol excluding the input symbol. This is computed by considering all positions P' on AL(I) distinct from P. Note that REC_ROW(P') in ISDS 510 stores the row number of the recovered value for the input symbol in position P', and that VALUE(REC_ROW(P')) in OSDS 505 is this recovered value. This computation is shown in 850 of FIG. 8(*a*), and the recovered value for the input symbol in position P is stored in VALUE(R')=VALUE(REC_ROW(P)) at the end of this computation.

A variation of the process shown in FIG. 8(*a*) is shown in FIG. 8(*b*). There, instead of performing steps 830, 835, 840, 845 and 850 for each output symbol as it is processed, the values of R' and P can be stored in an execution schedule for later processing (865). An example of deferred execution processing is shown in FIG. 8(*c*) including steps referenced as 870, 875, 880 and 885. In this variation, the flowchart shown in FIG. 6 is modified by initializing E to zero in step 605. The deferred processing of the execution schedule can occur after the decoder determines that the received symbols are enough to decode the entire file, e.g., at step 640 after it is known that all input symbols are recoverable. In some cases, especially where the input symbols are large, the execution of the schedule could be deferred until the input file, or portions thereof, are needed at the receiver.

In either variation, i.e., in either FIG. 8(*a*) or FIG. 8(*b*), at step 855 the output symbols that still have input symbol P as an associate are modified to reflect that the input symbol has been recovered. The row numbers of these output symbols in OSDS 505 are stored in RL(P). For each row number R" in RL(P), WEIGHT(R") is decremented by one and P is XORed into XOR_POS(R") to reflect the removal of the input symbol in position P as an associate of the output symbol in row R" of OSDS 505. If this modification causes the output symbol in row R" of OSDS 505 to become weight one, i.e., WEIGHT (R")=1, then this output symbol is added to the decodable set by setting OUT_ROW(S) to R", IN_POS(S) to XOR_POS (R"), and incrementing S by one. Finally, the space used for storing row numbers of output symbols on list RL(P) is returned to free space (860), and processing continues at step 805.

An Associator Implementation

The mapping from an output symbol key to associated input symbols (i.e., the determination of the weight W(I) and the list AL(I) of positions of associates for a key I) can take a variety of forms. W(I) should be chosen to be the same value by both the encoder and decoder for the same key I (in the sender and the recipient, respectively). Similarly, AL(I) should be chosen to contain the same list of positions by both encoder and decoder for the same key I. The associator is the object that calculates or generates AL(I) from I and usually W(I) and K.

In one embodiment, W(I) and AL(I) are determined in a manner designed to mimic a random process. To satisfy the requirement that the encoder and decoder produce the same result with respect to the same key, a pseudorandom sequence could be generated by both encoder and decoder seeded with the key. Instead of a pseudorandom sequence, a truly random sequence might be used for the generation of W(I) and/or AL(I), but for that to be useful, the random sequence used for generating W(I) and AL(I) would need to be communicated to the recipient.

In the decoder shown in FIG. 4, the output symbol buffer 405 requires storage for each output symbol's list of positions of associates, i.e., storage in the column labeled AL(I). The more efficient decoder shown in FIG. 5 does not require this storage, because a list of associates is recalculated as it is needed, e.g., as shown in FIGS. 9-10. There is an advantage in recalculating associate lists each time in order to save storage only if these calculations can be done quickly as needed.

A preferred embodiment of associator 220 is shown in FIG. 9 and operates according to the process shown in FIG. 10. This associator can be used in the encoder as well as in the decoder. Although memory storage for AL(I) at the encoder is not much of a concern, because the encoder does not normally need to store more than one AL(I) at a time, the same process should be used at both the encoder and decoder to ensure that the values for AL(I) are the same in both places.

The input to associator 220 is a key I, the number of input symbols K, and a weight W(I). The output is a list AL(I) of the W(I) positions of associates of the output symbol with key I. As shown in FIG. 9, the associator comprises a table ASSOC_RBITS 905 of random bits and a calculator ASSOC_CALC 910. Before a specific AL(I) is generated, the size of the input file is adjusted so that the number of input symbols is prime. Thus, if the input file begins with K input symbols, the smallest prime number, P, greater than or equal to K is identified. If P is greater than K, P−K blank (e.g., set to zero) input symbols are added to the input file and K is reset to P. For this modified input file, lists AL(I) of positions of associates are computed as shown in FIGS. 9 and 10.

In this embodiment, ASSOC_CALC 910 operates as described below and as shown in the flowchart of FIG. 10. The first step is to use the key I, the number of input symbols K and the table of random bits ASSOC_RBITS 905 to generate two integer values X and Y that have the property that X is at least one and at most K−1, and Y is at least zero and at most K−1 (1005). Preferably, X and Y are independently and uniformly distributed within their respective ranges. Next, an array V[ ] with W(I) entries is initialized for storage of AL(I) as its members are calculated (1010). Since V[ ] is just temporary storage for one list, it would occupy much less memory than the AL(I) column of output symbol buffer 405 (see FIG. 4). V[0] (this is the first element of the list AL(I)) is set to Y (1015). Then, for all values of J starting at 1 and ending at W(I)−1, the value of V[J] is set to (V[J−1]+X) mod K, as shown in steps 1020-1050. Since K is prime and W(I) is at most K, all of the V[ ] values will be unique. As shown, the "mod K" operation can be a simple compare and subtract operation, i.e., steps 1035 and 1040. Thus, the process of producing the list of positions of associates of a given output symbol is very efficient.

One advantage of the above approach to calculating AL(I) is that it produces enough variety in the distribution on the positions of the associates to ensure that the decoding algorithm works with high probability with minimal reception overhead (i.e., the input file is recovered after receiving only slightly more than K output symbols, assuming input symbols and output symbols are the same length) when coupled with a good procedure for selecting W(I).

A Weight Selector Implementation

The performance and efficiency of the encoder/decoder is dependent on the distribution of weights and some distributions are better than others. The operational aspects of weight selection are discussed below, followed by a description of some important weight distributions. The block diagram of FIG. 11 and the flowchart of FIG. 12 are used to illustrate these concepts.

As shown in FIG. 11, the weight selector comprises two processes WT_INIT 1105 and WT_CALC 1110, and two tables WT_RBITS 1115 and WT_DISTRIB 1120. Process WT_INIT 1105 is invoked only once when the first key is passed in to initialize table WT_DISTRIB 1120. The design of WT_DISTRIB 1120 is an important aspect of the system, and is considered later in much more detail. Process WT_CALC 1110 is invoked on each call to produce a weight W(I) based on a key I. As shown in the flowchart of FIG. 12, WT_CALC 1110 uses the key and random bits stored in table WT_RBITS to generate a random number R (1205). Then the value of R is used to select a row number L in table WT_DISTRIB 1120.

As shown in FIG. 11, the entries in the RANGE column of WT_DISTRIB 1120 are an increasing sequence of positive integers ending in the value MAX_VAL. The set of possible values for R are the integers between zero and MAX_VAL−1. A desirable property is that R is equally likely to be any value in the range of possible values. The value of L is determined by searching the RANGE column until an L is found that satisfies RANGE(L−1) ≦R<RANGE(L) (1210). Once an L is found, the value of W(I) is set to WT(L), and this is the returned weight (1215, 1220). In FIG. 11 for the example table shown, if R is equal to 38,500, then L is found to be 4, and thus W(I) is set to WT(4)=8.

Other variations of implementing a weight selector and associator include generating I pseudorandomly and generating W(I) and AL(I) directly from I. As should be apparent, W(I) can be determined by examining AL(I), since W(I) is the equal to the number of associates in AL(I). It should be apparent from this description that many other methods of generating W(I) values are equivalent to the just-described system to generate a set of W(I) values with the distribution defined by WT_DISTRIB.

An Alternative Decoder

Upon reading this disclosure, it should be clear to those of skill in the art that a receiver can work more efficiently than the implementations described above. For example, the receiver might be more efficient if it buffered packets and only applied the recovery rule once a group of packets arrived. This modification reduces computational time spent in doing subsequently unnecessary operations and reduces overhead due to context switching. In particular, since the decoder cannot hope to recover the original file of K input symbols before at least K output symbols (assume same size input and output symbols) arrive in K packets (assume one symbol per packet), it is beneficial to wait until at least K packets arrive before beginning the decoding process.

Figure 13:
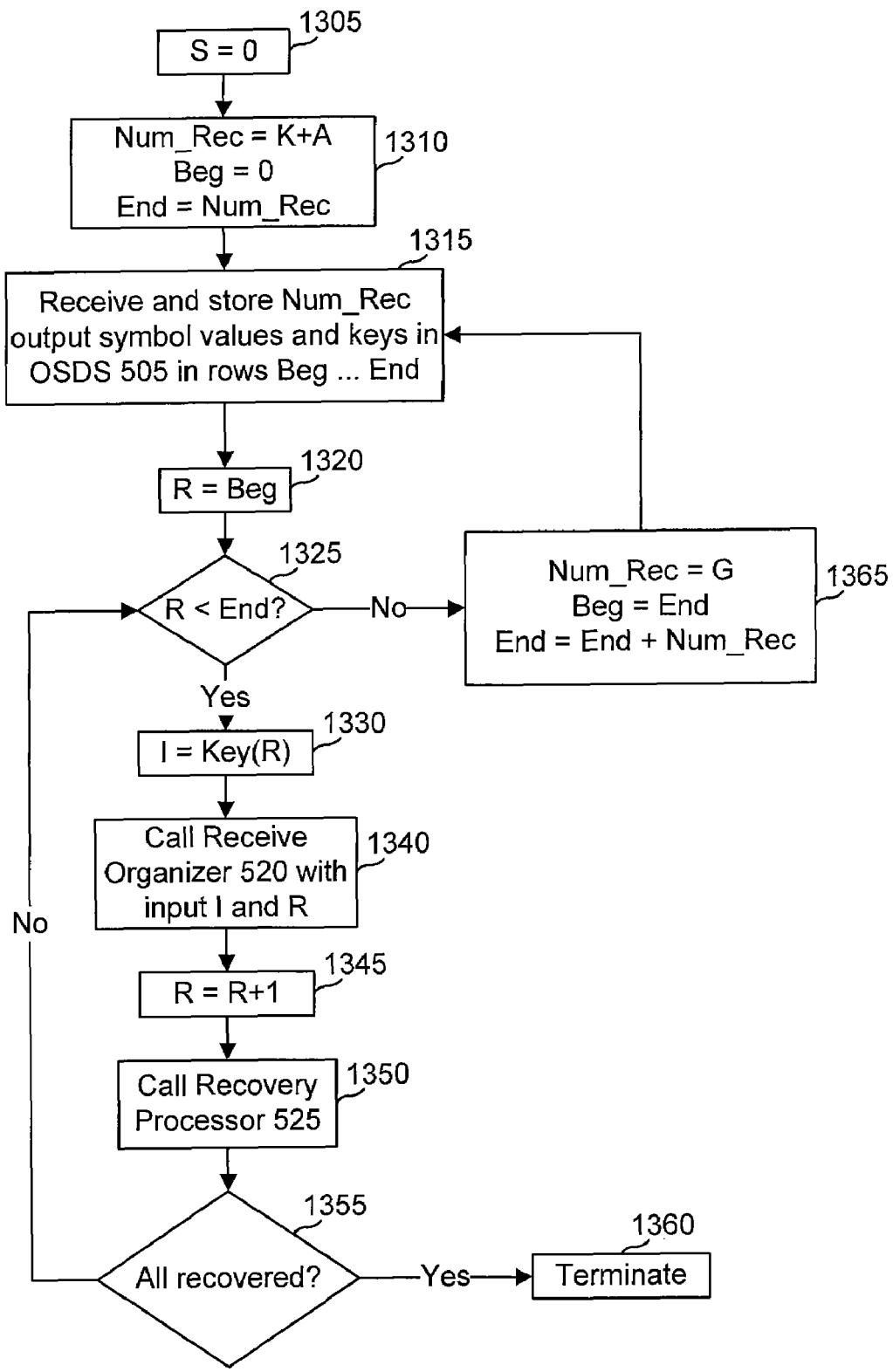
FIG. 13 is a flowchart of a process for decoding for a decoder that does not need to be particularly efficient.

FIG. 13 shows a different method of decoding, which includes the concepts expressed above and which is a modification of the process used by the decoder of FIG. 6. The primary difference between the two methods is that the method of FIG. 13 receives output symbols in batches, as shown in 1315. The size of the first batch is set to K+A, where A is a small fraction of the number of input symbols K (1310). After the first batch of output symbols is received, the output symbols are processed as before, using receive organizer 520 (1340) to process output symbols intermingled with using recovery processor 525 (1350) to process the decodable set and recover input symbols from output symbols of reduced weight one. If recovery of all K input symbols is not achieved using the first batch of K+A output symbols, then additional batches of G output symbols are received and processed until all input symbols are recovered.

It is advantageous to minimize the storage required for the decoder's auxiliary data structures as much as possible. As already described, storage for the associates list for each output symbol is not needed, since associator 220 can be used to quickly calculate those lists as needed. Another storage need is for storing, for each as yet unrecovered input symbol, the row number in OSDS 505 of the output symbols that have the input symbol as an associate, i.e., the space for the lists shown in the RL column in table ISDS 510 of FIG. 5. As already described in step 855 of FIG. 8, one use of this storage is to be able to quickly identify which output symbols are reducible when a given input symbol is reconstructed. Unless it is done efficiently, the storage required for these lists would be proportional to the total number of associates of all output symbols used to recover all the input symbols.

A Presorting Decoder

Figure 14:
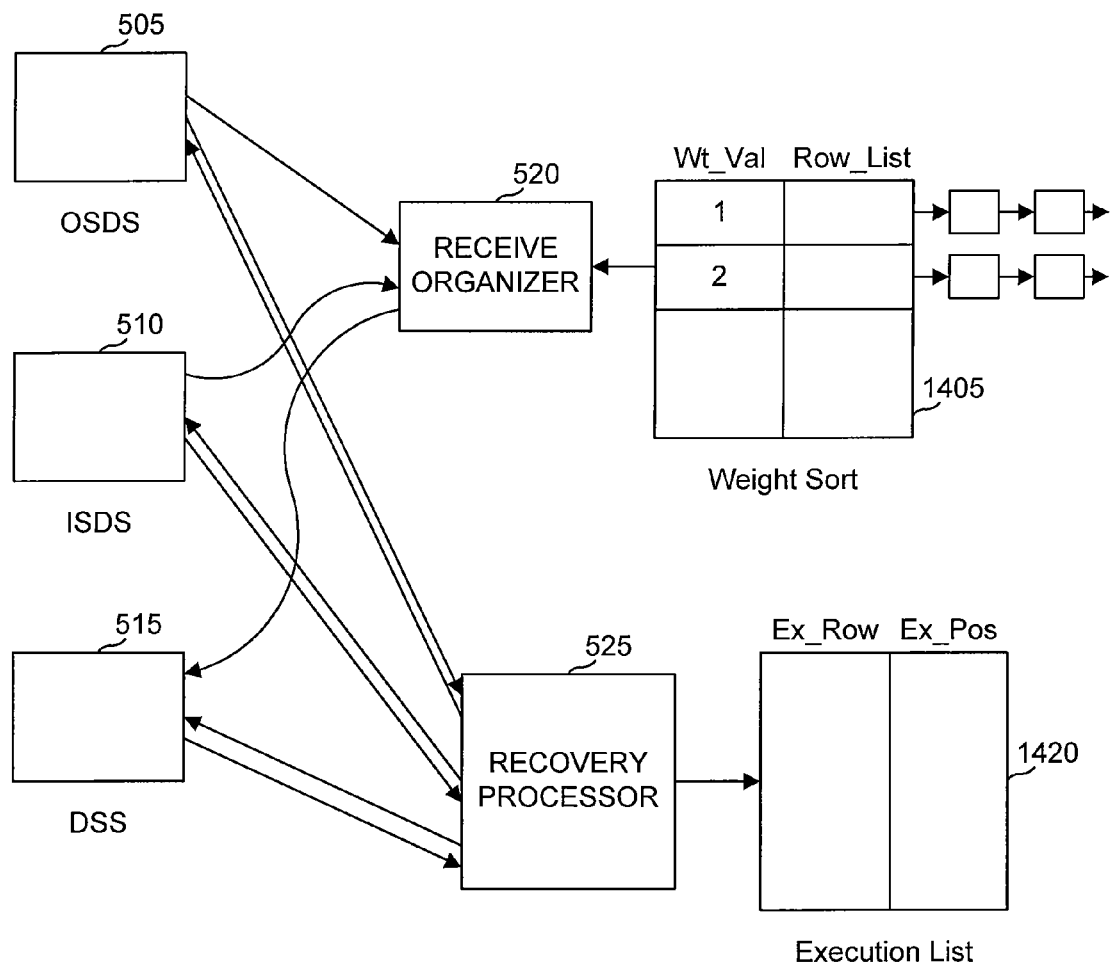
FIG. 14 is a block diagram of a more efficient decoder.
Figure 15:
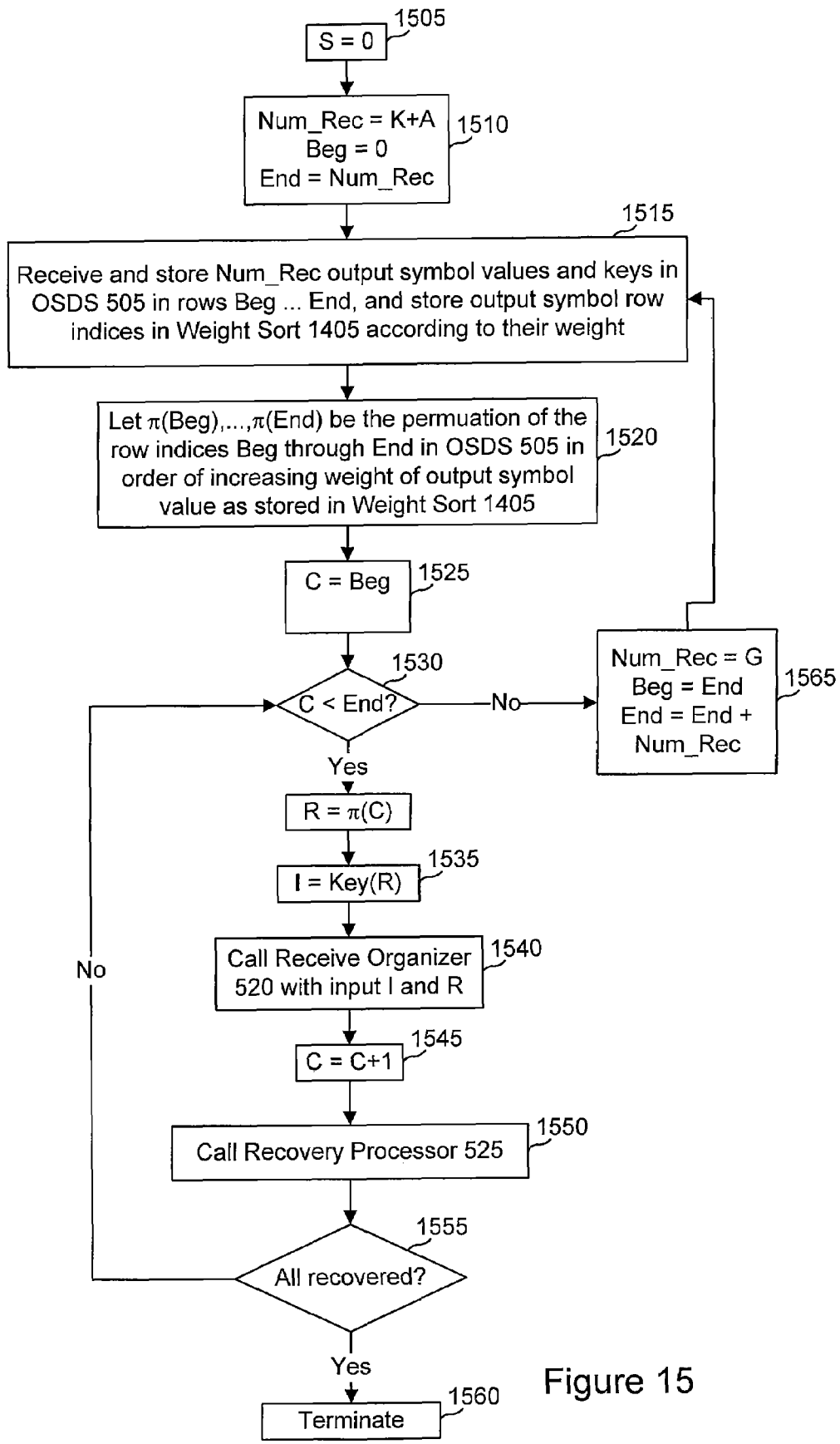
FIG. 15 is a flowchart of a process for decoding as might be implemented using the decoder of FIG. 14 for decoding more efficiently than the decoding described with reference to FIGS. 12-13.
Figure 16:
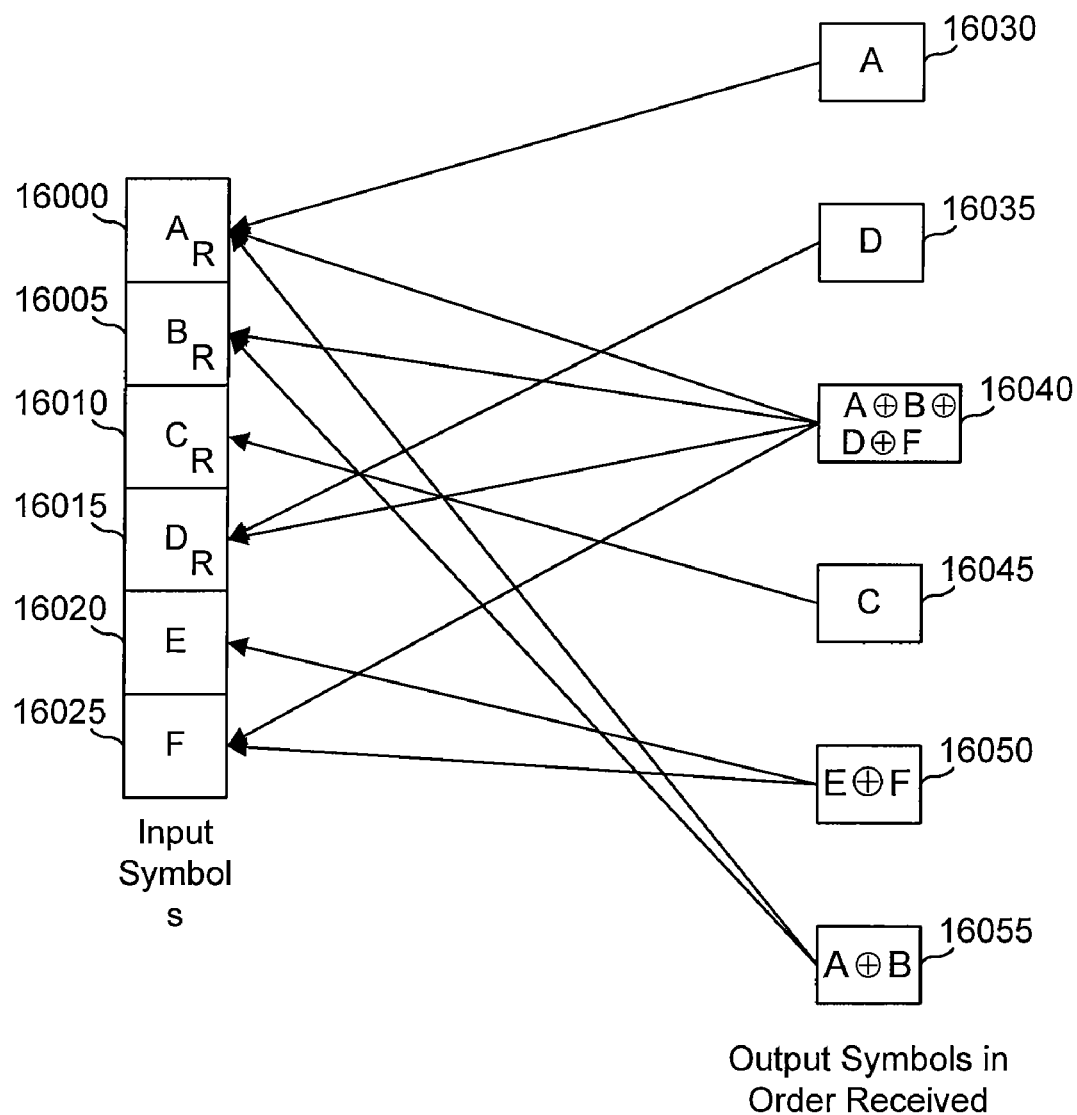
FIG. 16 is a diagram illustrating an example of a document and received output symbols for the decoding process of FIG. 15.

A more preferred embodiment of the decoder is now described, referring to FIG. 14 and FIG. 15. FIG. 14 shows the parts that comprise the decoder, which is the same as those shown in FIG. 5 except for the addition of a table WEIGHT SORT 1405 and the EXECUTION LIST 1420 used to store the execution schedule formed as described in FIG. 8(b). Table WEIGHT SORT is used to store batches of row numbers in OSDS 505 of output symbols as they are received sorted in order of increasing weight. The WT_VAL column is used to store weights, and the ROW_LIST column is used to store row numbers of output symbols in OSDS 505. In general, the row numbers of all output symbols with weight WT_VAL(L) are stored in ROW_LIST(L). This table is used to process the batch of output symbols in order of increasing weight, as shown in step 1520 of FIG. 15. Low weight output symbols are less computationally intensive to use to recover an input symbol, and it is likely, as the larger weight output symbols come along, that most of their associates will already be recovered, and thus it saves substantially on the link storage space (the decoder can recover space used by recovered input links, and output symbols that are being processed will have few associates not yet recovered).

Processing output symbols in batches of appropriate sizes in order of increasing weight lowers the memory requirements as well as the processing requirements.

As shown in FIG. 15, slightly more than K output symbols (denoted by K+A output symbols in the figure) are allowed to arrive before any processing begins (1515). Here, we assume one output symbol per packet, the same size input and output symbols and K input symbols in the input file. Initially, the decoder simply waits for receipt of the K+A output symbols, since the decoder should not expect to be able to recover the input file from less than K+A output symbols anyway, and cannot possibly recover an arbitrary input file from less than K output symbols. In practice, $5 \cdot \sqrt{K}$ was found to be a good value for A.

The row numbers in OSDS 505 of received output symbols are stored in table WEIGHT SORT 1405 of FIG. 14 in order of increasing weight, as shown in step 1515 of FIG. 15. If T is the number of possible output symbol weights then for values of L between 1 and T, list ROW_LIST(L) contains all received output symbols of weight WT_VAL(L), where 1=WT_VAL(1)<WT_VAL(2)<WT_VAL(3)<...<WT_VAL(T) and WT_VAL(T) is the maximum weight of any output symbol. Then, the rest of the operation of the decoder shown in FIG. 15 is exactly the same as for the decoder shown in FIG. 13, except that output symbols are processed in order of increasing weight, as shown in step 1520.

Normally, K+A output symbols will suffice to recover all input symbols. However, some sets of K+A packets might not suffice to recover all input symbols. In such cases, batches of G additional packets are received and then processed until all input symbols are recovered. A good setting for G is $\sqrt{K}$.

FIGS. 16-19 shows a snapshot of an example run of the process described in FIG. 15. In this example, six output symbols (16030, 16035, 16040, 16045, 16050, 16055) have been received with associates (16000, 16005, 16010, 16015, 16020, 16025) indicated as shown by the arrowed lines in FIG. 16. Initially, output symbols with values A, D, ABDF, C, EF and AB (the "" operation being an XOR operation) are received and stored in OSDS 505 as shown in FIG. 17. The row number in OSDS 505 is stored in ROW_LIST in the row corresponding to the weight of the output symbol, as shown in FIG. 18. The output symbols of weight one are in row 0, in row 1, and in row 3 of OSDS 505. Thus, ROW_LIST(0), which corresponds to output symbols of weight WT_VAL (0)=1, contains row numbers 0, 1 and 3, as shown in FIG. 18. Similarly, ROW_LIST(1) contains 4 and 5 and ROW_LIST (3) contains 2.

At this point in the process, the first five output symbols in order of increasing weight have been processed, the sixth output symbol in row 2 of OSDS 505 has been processed by receive organizer 520 and this sixth output symbol is just about to be processed by recovery processor 525. Output symbols in rows 0, 1, 3 and 5 have already been added to the schedule to eventually recover input symbols in positions 0, 3, 2 and 1, respectively. The output symbol in row 4 of OSDS 505 has two associates at positions 4 and 5 that have not as yet been recovered, and thus there are links from positions 4 and 5 in ISDS 510 back to row 4 in OSDS 505. The output symbol in row 2 of OSDS 505 has four associates in positions 0, 1, 3, and 5. The three associates in positions 0, 1 and 3 have already been marked as recovered, and thus there is no link from them back to row 2 (they caused the weight of this output symbol to be reduced from 4 to 1, which will trigger the recovery of the remaining input symbols in positions 4 and 5 once recovery processor 525 is executed). The associate in position 5 has not been recovered, and thus the receive organizer 520 added a link from position 5 in ISDS 510 to row 2 in OSDS 505. This is all shown in FIG. 17. Thus, at this point in the process, a total of only three links from input symbols back to output symbols which have them as associates are in use. This compares favorably with the straightforward implementation that uses a link from every input symbol to every output symbol having it as an associate. In this example, there are eleven possible such links.

In general, the savings in storage space for links is dramatically reduced when using the process described in FIGS. 14 and 15 over the process described in FIG. 13, e.g., the savings in space is typically a factor of 10 to 15 in link space when the number of input symbols is 50,000. The reason for this reduction is that smaller weight output symbols are more likely to recover input symbols at the beginning of the process then at the end, and heavier weight output symbols are much more likely to recover output symbols at the end of the process then at the beginning. Thus, it makes sense to process the output symbols in order of increasing weight. A further advantage of the process described in FIGS. 14 and 15 over FIG. 13 is that the decoding is typically 30% to 40% faster. This is because the smaller weight output symbols are more likely to be used to recover input symbols than the heavier weight output symbols (since the smaller weight output symbols are considered first), and the cost of recovering a particular input symbol directly depends on the weight of the output symbol used to recover it.

Selecting a Weight Distribution

An important optimization is to design the coding process so that an input file can be fully reconstructed with as few output symbols as possible. This optimization is helpful where the transmission time and bandwidth is costly or limited, or where an input file must be decoded quickly, without waiting for additional output symbols. Typically, the sufficient number of output symbols needed to reconstruct an input file is slightly larger than the number of input symbols in the original input file (assuming the same size input and output symbols). It can be shown that an arbitrary input file cannot be recovered when fewer bits have been received than are in the input file. Therefore, a perfect coding scheme will allow recovery of an input file from any set of output symbols encoding the same number of bits as the input file, and one measure of coding efficiency is how few extra bits are needed under expected conditions.

In the decoder shown in FIG. 5, the maximum efficiency is obtained when recovery processor 525 recovers the last unknown input symbol after the decoder has received exactly K output symbols. If more than K output symbols have been received by the decoder by the time all the input symbols can be recovered, then output symbols would have been received that were not needed or used for recovery of the input file. While maximum efficiency is nice, targeting for it should be tempered by the risk that DSS 515 will be empty before reconstruction is complete. In other words, at maximum efficiency, the size of the decodable set hits zero just as reconstruction ends, but encoding/decoding should be arranged so that there is no more than a small probability that the size of the decodable set would hit zero before the end of the reconstruction using K+A output symbols, so that additional sets of G output symbols are not needed.

Figure 20:
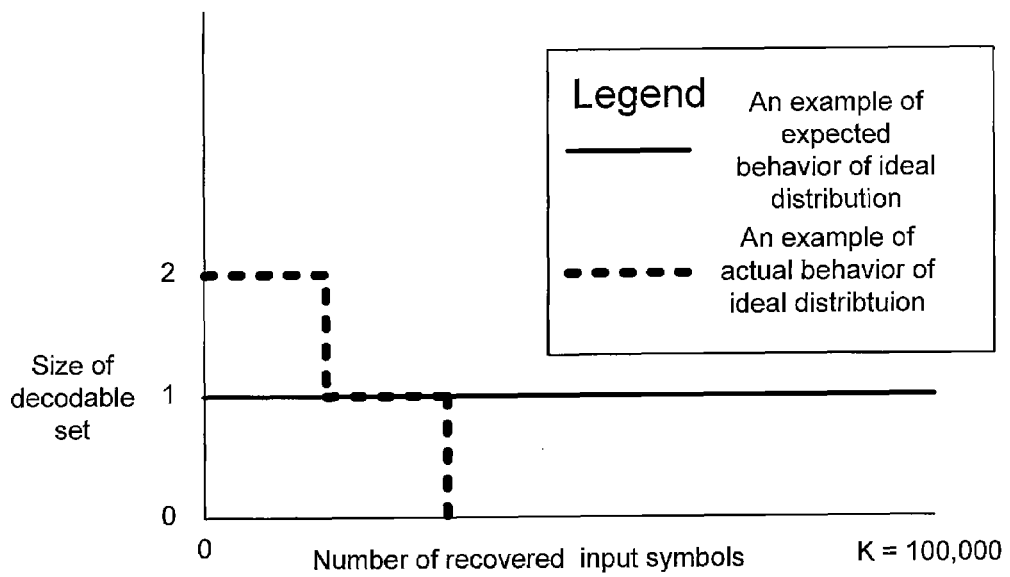
FIG. 20 illustrates the progress of the recovery process in the form of a plot of decodable set size versus number of input symbols recovered for an ideal distribution.

This point is illustrated in FIG. 20. That figure shows a plot of the size of a decodable set versus the number of input symbols reconstructed where the decoder is operating with K+A output symbols for an ideal distribution described below. In this example, A=0, i.e., the number of output symbols received to decode all the K input symbols is the minimum possible number (assuming input and output symbols are the same size). It should be understood that the plot may vary for any given function for determining weights and associates, and would also vary depending on which particular output symbols are received. In that plot, the expected size of the decodable set size is one at first and remains one throughout the recovery process. Thus, in expected behavior, there is always one output symbol in the decodable set that can be used to recover the next input symbol. FIG. 20 also shows an example of the actual behavior of the ideal distribution. Notice that in this actual run the decodable set is empty before recovery is completed. This actual behavior of the ideal distribution is typical, i.e., for the ideal distribution random fluctuations almost always empty the decodable set before all input symbols are recovered, and this is the reason that a more robust distribution is needed as described below.

Efficiency is improved by limiting the number of times a decodable set member, which has but one associated input symbol in the case of an XOR value function, has an already reconstructed input symbol as its associate. This can be accomplished by suitable selection of the function for generating W(I).

Thus, while it is possible to completely recover an input file with any desired degree of certainty, by receiving enough output symbols, it is preferable to design a chain reaction coding communications system such that there is a high probability of recovering the K input symbols comprising a complete input file with as few as K+A output symbols (assume the same size for input symbols and output symbols) for some small value of A. The minimum value for A is zero, and can be achieved in some coding schemes, such as Reed-Solomon coding, but in accepting some small nonzero value for A, an improved communications system can be obtained.

Small values of A can be achieved in chain reaction coding by using the appropriate distributions determine the weight distribution for output symbols, i.e., the distribution of W(I) over all I, and the distribution of associates over the output symbols, i.e., the memberships of AL(I) over all I. It should be emphasized that while the decoding process can be applied regardless of the weight distribution and the distribution on the choice of the associates, the preferred embodiments will use weight distributions and distributions on the choice of associates specifically chosen for near optimal performance. In fact, many distributions will perform well, as small variations in the chosen distribution may lead to only small changes in performance.

The methodology for determining the distributions in one preferred embodiment will now be described. The actual weight distributions used are based on an ideal mathematical distribution. In the ideal weight distribution, the weights W(I) are chosen according to an "ideal" probability distribution. The smallest weight is one and the largest weight is K, where K is the number of input symbols. In the ideal distribution, a weight equal to a value of i is chosen with the following probability p:

| | |
|---|---|
| for i = 1: | p = 1/K; and |
| for i = 2, . . . , K: | p = 1/(i(i − 1)). |

Once a weight W(I) chosen, a list AL(I) of W(I) associated input symbols are chosen independently and uniformly at random (or pseudorandomly, if needed), making sure that all chosen associates are distinct. Thus, the first associate is randomly selected among the K input symbols, each having a probability of 1/K of being selected. The second associate (if W>1) is then randomly selected among the remaining K−1 symbols. The weight probability distribution shown above has the property that if the system behaved exactly as expected, exactly K output symbols would be sufficient to decode and recover all input symbols. This expected behavior for the ideal distribution is shown in FIG. 20 by the solid line. However, because of the random nature of selection of the weights and the associates, and because an arbitrary set of output symbols are used in the decoding process, the process will not always behave that way. An example of an actual behavior for the ideal distribution is shown in FIG. 20 by the dotted line. Hence, the ideal weight distribution must be modified somewhat in practice.

Generally, the best parameters for a given setting can be found by computer simulation. However, a simple variation on the ideal weight distribution is an effective option. In this simple variation, the ideal weight distribution is modified slightly by increasing the probability of output symbols of weight one and of high weight output symbols, to reduce the chance of the decodable set emptying before the K+A output symbols are processed. The extra supply of weight one output symbols decreases the chance that the process will run out of weight one output symbols (i.e., empty the decodable set) until the recovery process is near the end of the recovery of the input symbols. The extra supply of high weight output symbols increases the chance that, near the end of the recovery process, for each yet unrecovered input symbol there will be at least one output symbol that will have that input symbol as its unique remaining associate.

More specifically, the modified weight distribution is as follows:

| | |
|---|---|
| for i = 1: | $p = n \cdot R1/K$; |
| for i = 2, . . . , (K/R2 – 1): | $p = n/(i(i-1)(1-iR2/K))$; and |
| for i = K/R2, . . . , K: | $p = n \cdot HW(i)$ | where K is the number of input symbols, R1 and R2 are tunable parameters and n is a normalization factor used so that the p values all sum to one.

The calculation of HW(i) and sample values for R1 and R2 are shown in detail in Appendix A. There, the C++ symbols nStartRippleSize, nRippleTargetSize and nSegments correspond with R1, R2 and K, respectively, in the above equations.

This modified distribution is similar to the ideal mathematical weight distribution, with more output symbols of weight 1 and of higher weight and the distribution rescaled accordingly. As shown in the modified distribution, R1 determines the initial fraction of weight one output symbols as well as determining the multiple of the increased probability of weight one symbols and R2 determines the boundary between the "higher" weights and the "not so high" weights.

Figure 21:
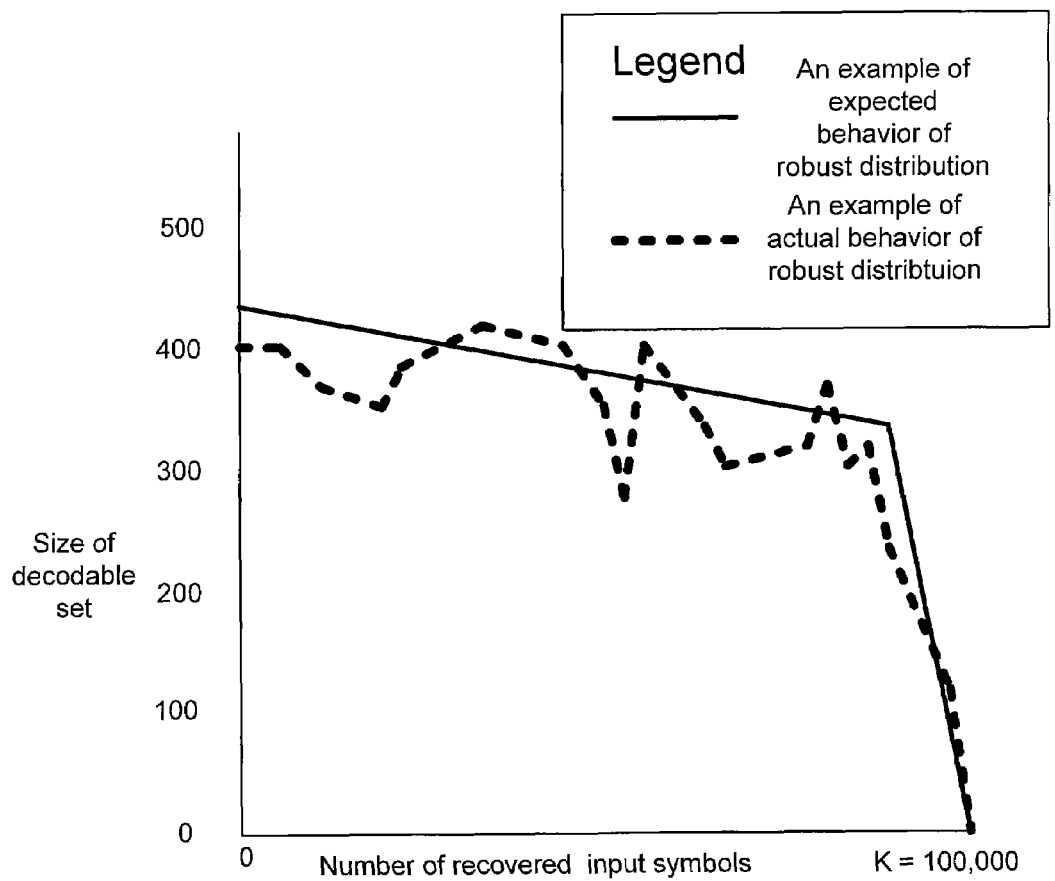
FIG. 21 illustrates the progress of the recovery process in the form of a plot of decodable set size versus number of input symbols recovered for a robust weight distribution.

Good choices for R1 and R2 generally depend on K and can be determined empirically. For example, having R1 equal to 1.4 times the square root of K and R2 equal to two plus twice the fourth root of K works well in practice. Thus, for K=4000, setting R1=89 and R2=18 works well; when K is 64000, setting R1=354 and R2=34 works well. More detailed calculations of R1 and R2 are shown in Appendix A. FIG. 21 shows that the expected behavior of this distribution leaves the decodable set moderately large throughout the recovery process so that under actual runs the random fluctuations from the expected behavior is unlikely to empty the decodable set before all input symbols are recovered.

Although the reconstruction processes described above is similar to the one used for Tornado codes, the different process used to build the code leads to extremely different effects. In particular, as described earlier, the memory required for chain reaction encoding is significantly less than for Tornado codes, and the ease of use of chain reaction codes in diverse situations far exceeds that of Tornado codes, at possibly the expense of some speed. The mathematical details underlying the processes are described in more detail below.

Properties of Some Chain Reaction Codes

The number of output symbols generated and sent through the channel is not limited with chain reaction coding as with other coding schemes, since keys need not have a one-to-one correspondence with input symbols and the number of different values of I is not limited to some ratio of input symbols. Therefore, it is likely that even if the decodable set goes empty before the input file is reconstructed, the decoding process will not fail, since the decoder can gather as many more output symbols as needed to get at least one more output symbol of weight one. When that output symbol of weight one is received, it populates the decodable set and, by the chain reaction effect, might cause reduction of previously received output symbols down to weight one so that they can, in turn, be used to reconstruct input symbols.

In most of the examples described above, the input and output symbols encode for the same number of bits and each output symbol is placed in one packet (a packet being a unit of transport that is either received in its entirety or lost in its entirety). In some embodiments, the communications system is modified so that each packet contains several output symbols. The size of an output symbol value is then set to a size determined by the size of the input symbol values in the initial splitting of the file into input symbols, based on a number of factors. The decoding process would remain essentially unchanged, except that output symbols would arrive in bunches as each packet was received.

The setting of input symbol and output symbol sizes is usually dictated by the size of the file and the communication system over which the output symbols are to be transmitted. For example, if a communication system groups bits of data into packets of a defined size or groups bits in other ways, the design of symbol sizes begins with the packet or grouping size. From there, a designer would determine how many output symbols will be carried in one packet or group and that determines the output symbol size. For simplicity, the designer would likely set the input symbol size equal to the output symbol size, but if the input data makes a different input symbol size more convenient, it can be used.

Another factor in determining the input symbol size is to choose the input symbol size so that the number of input symbols, K, is large enough to keep the reception overhead minimal. For example, K=10,000 leads to an average reception overhead of 5% to 10% with moderate fluctuations, whereas K=80,000 leads to an average reception overhead of 1% to 2% with very little fluctuation. As an example, in one test comprising 1,000,000 trials with K=80,000, the reception overhead never exceeded 4%.

The above-described encoding process produces a stream of packets containing output symbols based on the original file. The output symbols hold an encoded form of the file, or more succinctly the encoded file. Each output symbol in the stream is generated independently of all other output symbols, and there is no lower or upper bound on the number of output symbols that can be created. A key is associated with each output symbol. That key, and some contents of the input file, determines the value of the output symbol. Consecutively generated output symbols need not have consecutive keys, and in some applications it would be preferable to randomly generate the sequence of keys, or pseudorandomly generate the sequence.

Chain reaction decoding has a property that if the original file can be split into K equal-sized input symbols and each output symbol value is the same length as an input symbol value, then the file can be recovered from K+A output symbols on average, where A is small compared to K. For example, A might be 500 for K=10,000. Since the particular output symbols are generated in a random or pseudorandom order, and the loss of particular output symbols in transit is arbitrary, some small variance exists in the actual number of output symbols needed to recover the input file. In some cases, where a particular collection of K+A packets are not enough to decode the entire input file, the input file is still recoverable if the receiver can gather more packets from one or more sources of output packets.

Because the number of output symbols is only limited by the resolution of I, well more than K+A output symbols should be able to be generated. For example, if I is a 32-bit number, 4 billion different output symbols could be generated, whereas the file could consist of K=50,000 input symbols. In practice, only a small number of those 4 billion output symbols would be generated and transmitted and it is a near certainty that an input file can be recovered with a very small fraction of the possible output symbols and an excellent probability that the input file can be recovered with slightly more than K output symbols (assuming that the input symbol size is the same as the output symbol size).

The average number of arithmetic operations required to produce each output symbol is proportional to log K and so the total number of arithmetic operations required to decode and recover the input file is proportional to K log K. As shown above, an efficient decoding process exists that uses only slightly more memory than the memory required to store the input file (typically around 15% more). The above numbers show significant reductions in operations and storage compared with previously known coding techniques.

For example, Reed-Solomon codes are a standard code for communications applications. With Reed-Solomon codes, the input file is split into K input symbols, as with chain reaction coding, but the K input symbols in Reed-Solomon codes are encoded into N output symbols, where N is typically fixed before the encoding process begins. This contrasts with the present invention, which allows for an indeterminate number of output symbols.

One advantage of having an indeterminate number of output symbols is that if a recipient misses more output symbols than expected, either due to a poor channel or due to the recipient beginning after some output symbols have already passed it by, the recipient can just listen for a little longer and pick up more output symbols. Another advantage is that since the recipient may be gathering output symbols produced from multiple encoders, each encoder may have to provide only a small fraction of K output symbols and the number of symbols from one encoder may depend on how many encoders are supplying the recipient with output symbols.

Reed-Solomon codes also require substantially more time than chain reaction codes, for both encoding and decoding. For example, the number of arithmetic operations required to produce each output symbol with Reed-Solomon is proportional to K. The number of arithmetic operations required for decoding Reed-Solomon codes depends on which output symbols arrive at the recipient, but generally the number of such operations is proportional to $K^2$. Hence, in practice, acceptable values of K and N are very small, on the order of tens and possibly up to small hundreds. For example, Cross-Interleaved Reed-Solomon codes are used on compact disks (CDs) and CD-ROMs. For CDs, one standard code uses K=24 and N=28 and another standard code uses K=28 and N=32. For CD-ROMs, one standard code uses K=24 and N=26 and another standard code uses K=43 and N=45. Standard Reed-Solomon codes used for satellite transmission of MPEG files (MPEG is a file format for video and audio streams) use K=188 and N=204; generally these large values require specialized hardware.

Faster implementations of Reed-Solomon codes are known to exist which allow encoding in time cK log K and decoding in time c' K (log K)$^2$, but c and c' are prohibitively large constants that make these implementations slower than other implementations of Reed-Solomon codes for all but very large values of K, i.e., the efficiency crossover point is for values of K in the thousands or tens of thousands. Thus, for values of K below the crossover point, the other implementations of Reed-Solomon codes are faster. Although the faster implementations are faster than the other implementations at values of K above the crossover point, the faster implementations are slower at those values of K than chain reaction codes, by orders of magnitude.

Because of the speed limitations, only small values of K and N are generally feasible for Reed-Solomon codes. Consequently, their use on large files requires that the files be split into many subfiles and each subfile separately coded. Such splitting decreases the effectiveness of the codes to protect against packet loss in transmission.

One feature of Reed-Solomon codes is that any K distinct output symbols can be used by the recipient to decode the input file. It is provable that at least K output symbols are required to decode an arbitrary input file, and hence Reed-Solomon codes are optimal in this regard since K is also the maximum number of output symbols needed to decode the input file. Chain reaction coding, in contrast, generally requires K+A packets, where A is small compared to a suitably chosen K. In the network applications described previously, this disadvantage of possibly needing A additional symbols is greatly overshadowed by the speed advantage and the ability to seamlessly handle larger files.

Variations of the Basic Communication System

Embodiments of communication systems according to the present invention for a single channel have been described above in detail. The elements of those embodiments can be extended to advantageously use more than one channel.

Figure 22:
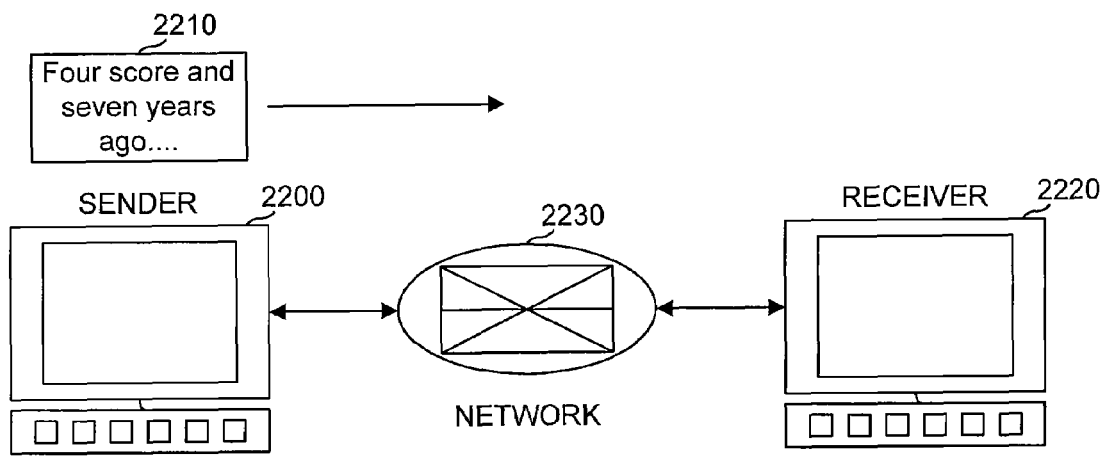
FIG. 22 is an illustration of a point-to-point communication system between one sender (transmitter) and one receiver using an encoder and a decoder as illustrated in previous figures.
Figure 23:
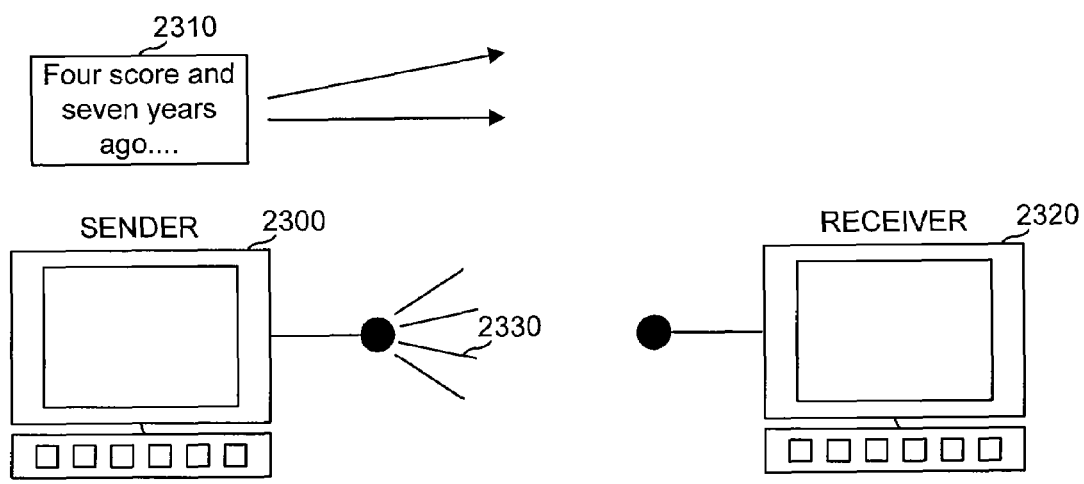
FIG. 23 is an illustration of a broadcast communication system between one sender and multiple receivers (only one of which is shown) using an encoder and a decoder as illustrated in previous figures.

FIGS. 22-23 show systems between two computers incorporating a communications system such as that shown in FIG. 1. The first example (FIG. 22) has a sender computer 2200 sending an input file 2210 to a recipient computer 2220 over a network 2230. The second example (FIG. 23) has a sender computer 2300 broadcasting an input file 2310 to recipient computers 2320 (only one is shown) over a wireless channel 2330. Instead of network 2330, any other physical communications medium, such as the wires of the Internet, might be used. Wireless channel 2330 might be a wireless radio channel, a pager link, a satellite link, an infrared link or the like. The configuration shown in FIG. 23 might also be used with wired or unwired media when one sender is sending an input file to many recipients, when the recipient is obtaining the input file from many senders, or when many recipients are obtaining the input file from many senders.

As should be apparent upon reading the above description, the chain reaction coding scheme described above can be used to send a file over a lossy transmission medium, such as a computer network, the Internet, a mobile wireless network or a satellite network, as a stream of packetized data with desirable properties. One such desirable property is that, once a decoding agent receives any set of sufficiently many packets from the stream, it can reconstruct the original file extremely quickly. Chain reaction coding is also useful in situations where many agents are involved, such as when one transmitting agent is sending the file to multiple receiving agents in a multicast or broadcast setting.

The chain reaction coding scheme is also useful in situations where multiple transmitting agents are sending the same file to multiple receiving agents. This allows for improved robustness against localized failure of the network infrastructure, allows receiving agents to seamlessly change from receiving packets from one transmitting agent to another, and allows receiving agents to speed up their download by receiving from more than one transmitting agent at the same time.

In one aspect, the chain reaction coding process described above performs the digital equivalent of a holographic image, where each part of a transmission contains an image of the transmitted file. If the file is a megabyte file, a user can just tap into a transmitted stream to obtain any arbitrary megabyte's worth of data (plus some extra overhead) and decode the original megabyte file from that megabyte.

Because chain reaction coding works with a random selection of data from the transmitted stream, downloads do not need to be scheduled or coherent. Consider the advantages of video-on-demand with chain reaction coding. A particular video could be broadcast as a continuous stream on a particular channel without coordination between the receiver and the transmitter. The receiver simply tunes into a broadcast channel for a video of interest and captures enough data to reconstruct the original video, without having to figure out when the transmission started or how to get copies of lost portions of the broadcast.

Figure 24:
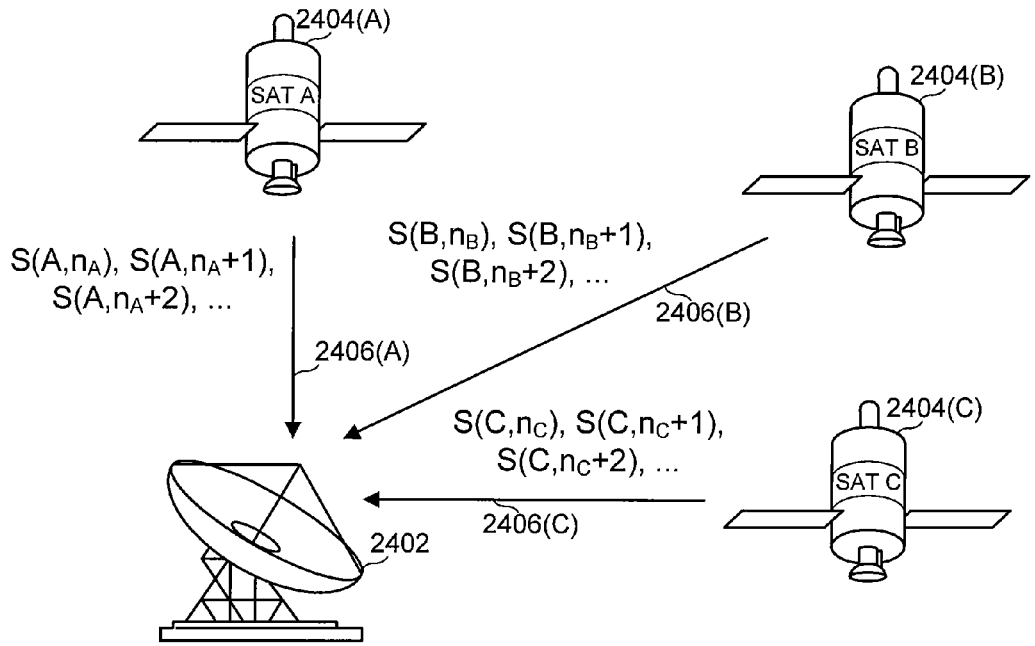
FIG. 24 is an illustration of a communication system according to one embodiment of the present invention where one receiver receives output symbols from multiple, usually independent, senders.
Figure 25:
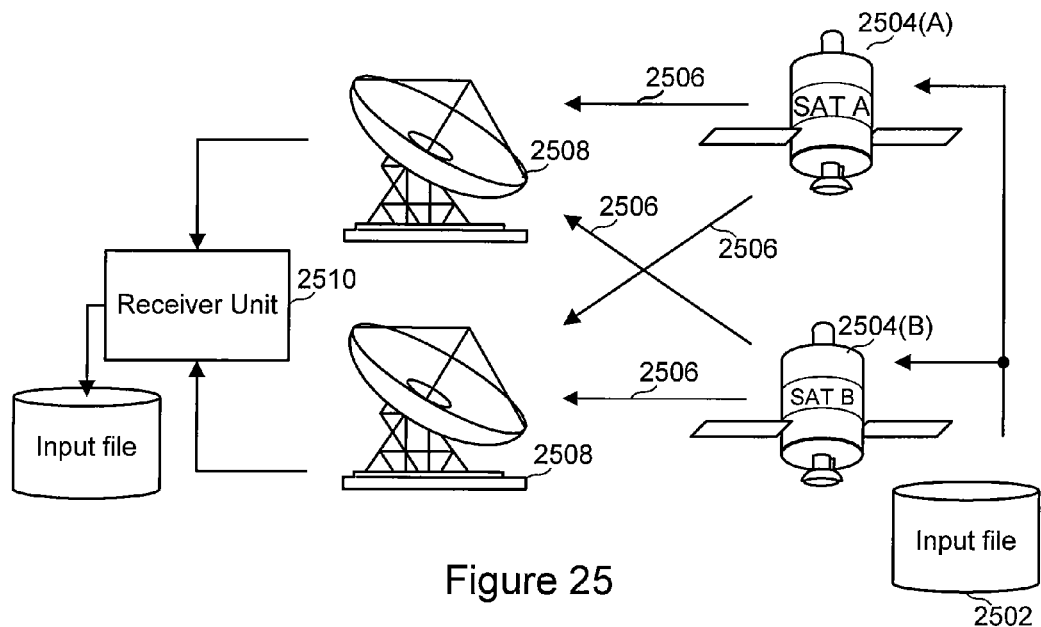
FIG. 25 is an illustration of a communication system according to one embodiment of the present invention where multiple, possibly independent, receivers receives output symbols from multiple, usually independent, senders to receive an input file in less time than if only one receiver and/or only one sender is used.

These concepts are illustrated in FIGS. 24-25. FIG. 24 illustrates an arrangement wherein one receiver 2402 receives data from three transmitters 2404 (individually denoted "A", "B" and "C") over three channels 2406. This arrangement can be used to triple the bandwidth available to the receiver or to deal with transmitters not being available long enough to obtain an entire file from any one transmitter. As indicated, each transmitter 2404 sends a stream of values, S( ). Each S( ) value represents an output symbol B(I) and a key I, the use of which is explained above. For example, the value $S(A, n_A)$ is the "$n_A$"-th output symbol and "$n_A$"-th key in a sequence of output symbols generated at transmitter 2402(A). The sequence of keys from one transmitter is preferably distinct from the sequence of keys from the other transmitters, so that the transmitters are not duplicating efforts. This is illustrated in FIG. 24 by the fact that the sequence S( ) is a function of the transmitter.

Note that transmitters 2402 do not need to be synchronized or coordinated in order not to duplicate efforts. In fact, without coordination, each transmitter is likely to be in a different location in its sequence (i.e., $n_A \neq n_B \neq n_C$). Since a random selection of K+A output symbols, maybe with a few bunches of G extra output symbols, can be used to recover an input file, the uncoordinated transmissions are additive instead of duplicative.

This "information additivity" is illustrated again in FIG. 25. There, copies of one input file 2502 are provided to a plurality of transmitters 2504 (two of which are shown in the figure). Transmitters 2504 independently transmit output symbols generated from the contents of input file 2502 over channels 2506 to receivers 2508. If each transmitter uses a distinct set of keys for symbol generation, the streams are likely to be independent and additive (i.e., they add to the information pool used to recover input symbols) rather than duplicative. Each transmitter of the two shown might need to only transmit (K+A)/2 output symbols before the receiver's decoder is able to recover the entire input file.

Using two receivers and two transmitters, the total amount of information received by a receiver unit 2510 can be as much as four times the information available over one channel 2506. The amount of information might be less than four times the single channel information if, for example, the transmitters broadcast the same data to both receivers. In that case, the amount of information at receiver unit 2510 is at least double and often more, if data is lost in any channel. Note that, even if the transmitters broadcast only one signal, but the receivers are in view at different times, there is an advantage to having more than one receiver listening to each transmitter. In FIG. 25, receiver unit 2510 performs the functions similar to the functions of receiver 150, decoder 155, key regenerator 160 and input file reassembler 165 shown in FIG. 1.

In some embodiments, input file 2502 is encoded in one computing device having two encoders so that the computing device can provide one output for one transmitter and another output for the other transmitter. Other variations of these examples should be apparent upon review of this disclosure.

It is to be understood that the coding apparatus and methods described herein may also be used in other communication situations and are not limited to communications networks such as the Internet. For example, compact disk technology also uses erasure and error-correcting codes to handle the problem of scratched disks and would benefit from the use of chain reaction codes in storing information thereon. As another example, satellite systems may use erasure codes in order to trade off power requirements for transmission, purposefully allowing for more errors by reducing power and chain reaction coding would be useful in that application. Also, erasure codes have been used to develop RAID (redundant arrays of independent disks) systems for reliability of information storage. The current invention may therefore prove useful in other applications such as the above examples, where codes are used to handle the problems of potentially lossy or erroneous data.

In some preferred embodiments, sets of instructions (or software) to perform the communication processes described above are provided to two or more multi-purpose computing machines that communicate over a possibly lossy communications medium. The number of machines may range from one sender and one recipient to any number of machines sending and/or receiving. The communications medium connecting the machines may be wired, optical, wireless, or the like. The above-described communications systems have many uses, which should be apparent from this description.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

APPENDIX A

SOURCE CODE LISTINGS

1. DFSolitonDistribution.cpp
// DFSolitonDistribution.cpp:
//         implementation of the CDFSolitonDistribution class.
//

APPENDIX A-continued

SOURCE CODE LISTINGS

```
// The probability distribution of the weights of output symbols is
// computed in the constructor and then is referred to by the Key
// Decoder when it decides what weight and pool are associated with
// a key.
//////////////////////////////////////////////////////////////
#include "DFSolitonDistribution.h"
#include <math.h>
//////////////////////////////////////////////////////////////
// Construction/Destruction
//////////////////////////////////////////////////////////////
CDFSolitonDistribution::CDFSolitonDistribution(
                int nSegments,
                int nRippleTargetSize,
                int nStartRippleSize)
{
    m_nSegments       = nSegments;
    // Unless the values of R and S are specified, use the constants
    // from DFSolitonDistribution.h with the formulas based on the
    // fourth root and the square root of the number of segments.
    m_nRippleTargetSize = nRippleTargetSize;
    // If a ripple target size is not preset, calculate it as
    // the fourth root of the number of segments, adjusted by an
    // offset and a multiplier.
    if (!m_nRippleTargetSize)
        m_nRippleTargetSize =
            int(knRAdd + kdRFactor * sqrt(sqrt(m_nSegments)));
    m_nStartRippleSize = nStartRippleSize;
    if (!m_nStartRippleSize)
        m_nStartRippleSize =
            int(kdSFactor * sqrt(m_nSegments));
//////////////////////////////////////////////////////////////
// Compute parameters of the Soliton distribution:
//
// This is the modified Robust distribution with tapered
// density at weights N/R, 2N/R,....N
//////////////////////////////////////////////////////////////
    m_nModulus = 0x1 << knPrecision ;
    // For the previous variation of the Robust distribution,
    // simply use -1 as the value
    m_nRobustKinds = m_nSegments/m_nRippleTargetSize - 2;
    if (m_nRobustKinds < 1)              m_nRobustKinds = 1;
    if (m_nRobustKinds > m_nSegments)    m_nRobustKinds = m_nSegments;
    // In the the previous variation of the Robust distribution,
    // m_nTailKinds is 0
    m_nTailKinds = 1;
    for (int d = m_nRippleTargetSize; d > 1; d /= 2)
        m_nTailKinds++;     // becomes log_2 (RippleTargetSize) + 1
    m_nKinds = m_nRobustKinds + m_nTailKinds;
    if (m_nKinds > m_nSegments)
    {
        m_nTailKinds = m_nSegments - m_nRobustKinds;
        m_nKinds = m_nSegments;
    }
    m_anKindWeight           = new int[m_nKinds];
    m_anKindCumulativeDensity = new int[m_nKinds];
    // adKindFraction is the un-normalized distribution
    double* adKindFraction   = new double[m_nKinds];
    // Weight 1 output symbols:
    adKindFraction[0]        = double(m_nStartRippleSize)/double(m_nSegments);
    m_anKindWeight[0]        = 1 ;
    // Densities according to the robust soliton distribution:
    for (int i=1; i < m_nRobustKinds; i++)
    {
        adKindFraction[i] = adKindFraction[i-1] + 1.0/(double(i) *
            double(i+1) * (1.0 - double((i+1)*m_nRippleTargetSize)
                                    /double(m_nSegments)));
        m_anKindWeight[i] = i+1 ;
    }
    int nRPower = 1;
    int j;
    for (i = 0; i < m_nTailKinds; i++)
        nRPower *= 2; // nRPower is next power of 2 > m_nRippleTargetSize
    // Densities for the tapered tail at the end of the distribution:
    // The weights go down from m_nSegments by a factor of 2 each time
    // and the density is inversely proportional to the weight.
    // j runs from 2 up to nRPower
    for (i=m_nRobustKinds, j=2; i < m_nKinds; i++, j*=2)
    {
```

APPENDIX A-continued

SOURCE CODE LISTINGS

```
            adKindFraction[i] = adKindFraction[i-1]
                    + kdTFactor * double(nRPower)/double(j *m__nSegments);
            m__anKindWeight[i] = (j*m__nSegments)/nRPower;
        }
        // Normalize to m__nModulus
        for (i=0; i < m__nKinds; i++)
            m__anKindCumulativeDensity[i] = int(adKindFraction[i] *
                            double(m__nModulus)/adKindFraction[m__nKinds-1]);
        delete adKindFraction;
        // Calculate maximum and average weight
        m__nMaxWeight = 0;
        for (i=0; i < m__nKinds; i++)
            if (m__anKindWeight[i] > m__nMaxWeight)
                        m__nMaxWeight = m__anKindWeight[i];
        ComputeAverageWeight( );
}
CDFSolitonDistribution::~CDFSolitonDistribution( )
{
        if (m__anKindWeight)            delete[ ] m__anKindWeight;
        if (m__anKindCumulativeDensity)   delete[ ] m__anKindCumulativeDensity;
}
void CDFSolitonDistribution::ComputeAverageWeight( )
{
        int i ;
        float fTemp ;
        fTemp = float(m__anKindWeight[0]) *
                    float(m__anKindCumulativeDensity[0]) ;
        for (i=1; i < m__nKinds; i++)
            fTemp += float(m__anKindWeight[i]) *
                        float(m__anKindCumulativeDensity[i] -
                            m__anKindCumulativeDensity[i-1]) ;
        m__nAverageWeight = int((fTemp/m__nModulus) + 1) ;
}
2. DFSolitonDistribution.h
// DFSolitonDistribution.h: interface for the CDFSolitonDistribution
// class.
//
// Note: The class CDFDominoKeyDecoder computes the weight and pool of
// neighbors for a given output symbol key. It refers to this class for
// the probability distribution for the weights and it refers to the
// CDFRandomBits class for the random integers used to make the choices.
//
/////////////////////////////////////////////////////////////
#include "DFRandomBits.h"
/////////////////////////////////////////////////////////////
//
// Constants used in the calculation of the distribution
//
/////////////////////////////////////////////////////////////
// The arithmetic precision of the distribution in bits.
// The density of the distribution is scaled to 2power this value.
const int       knPrecision   = 20;
// Constants relating to the calculation of R, the "ripple target size".
// This value is the expected ripple size in the "Robust Soliton
// Distribution". R gets the value kdRFactor * 4th root N + knRadd
// where N is the number of input symbols (segments).
const double    kdRFactor    = 2.0;
const int       knRAdd       = 2;
// S is the expected size of the ripple at the start of decoding,
// meaning the expected number of weight 1 output symbols when N symbols
// are received.
// S = kdSFactor * sqrt(N)
const double    kdSFactor    = 1.4;
// The tail of the distribution is given higher density at weights N,
// N/2,... down to N/R. The distribution density is inversely
// proportional to the symbol weight with kdTFactor as a constant of
// proportionality. The resulting distribution is still scaled according
// to the precision above.
const double    kdTFactor    = 1.6;
class CDFSolitonDistribution
{
        friend class CDFDominoKeyDecoder;
public:
        /////////////////////////////////////////////////////////////
        // Output Symbol Key and Input Symbol Position
        //
```

APPENDIX A-continued

SOURCE CODE LISTINGS

```
// This class defines the types TKey and TPos standing for Input
// Symbol Position. Other classes that need these types should
// refer to these below.
//////////////////////////////////////////////////////////
typedef unsigned int TKey;
typedef int             TPos;
CDFSolitonDistribution(
        int nSegments,
        int nRippleTargetSize  = 0,
        int nStartRippleSize   = 0);
virtual ~CDFSolitonDistribution( );
inline int    nAverageWeight( )    { return m__nAverageWeight;      };
inline int    nMaxWeight( )        { return m__nMaxWeight;          };
inline int    nParameterR( )       { return m__nRippleTargetSize;   };
inline int    nParameterS( )       { return m__nStartRippleSize;    };
// The probability distribution comprises an array of kinds where
// each kind corresponds to a weight for output symbols and a
// density (probability) associated with that weight.
inline int    nKinds( )            { return m__nKinds;              };
private:
    int     m__nAverageWeight;
    void    ComputeAverageWeight( );
    int     m__nRippleTargetSize;
    int     m__nStartRippleSize;
// m__nKinds is the size of the array that holds the probability
// distribution. It is the number of different weights of output
// symbols that are possible.
    int     m__nKinds;
// The following are the number of kinds from the truncated robust
// soliton dist. and the number of kinds due to the tapered tail
// distribution.
    int     m__nRobustKinds;
    int     m__nTailKinds;
    int     m__nModulus; // 2 to the precision
    int*    m__anKindWeight; // the weight corresponding to a kind
    int*    m__anKindCumulativeDensity; // probability density of a kind
    int     m__nSegments;
    int     m__nMaxWeight;
};
```

What is claimed is:

1. A method for processing encoded data in a decoder, the method comprising:
   receiving a first set of output symbols at the decoder, wherein the output symbols are derived from an ordered set of input symbols representing a data that is to be recovered, wherein the number of possible output symbols is much larger than the number of input symbols, wherein the total number of input symbols is estimated to be equal to K, wherein at least one output symbol is generated from more than one, but less than all, of the input symbols in the ordered set of input symbols;
   organizing the output symbols in the first set of output symbols at the decoder, wherein organizing the output symbols comprises:
   determining a key for each output symbol;
   computing a weight for each output symbol;
   computing a set of associates for each output symbol; and
   computing a value for each output symbol;
   processing the output symbols in the first set of output symbols to recover input symbols at the decoder; and
   processing the recovered input symbols to recover the data that is to be recovered at the decoder.

2. The method of claim 1 further comprising:
   sorting the output symbols using the weight of the output symbols at the decoder.

3. The method of claim 1 wherein the weight for an output symbol is computed as a function of the number of input symbols, K, and the key of the output symbol.

4. The method of claim 1 wherein the set of associates for an output symbol is computed as a function of the weight of the output symbol, the number of input symbols, K, and the key of the output symbol.

5. The method of claim 1 wherein the value of each output symbol is computed using an output value function.

6. The method of claim 5 wherein the output value function is selected as a function of the number of input symbols, K, and the key of the output symbol.

7. The method of claim 1 wherein processing the output symbols to recover input symbols at the decoder comprises:
   (i) identifying output symbols that are members of a decodable set;
   (ii) recovering input symbols associated with the output symbols in the decodable set;
   (iii) adjusting the value, the weight, and the set of associates of any output symbols that are not members of the decodable set using the recovered input symbols; and
   (iv) repeating steps (i)-(iii) until an adequate number of input symbols have been recovered or no additional input symbols can be recovered from the first set of output symbols.

8. The method of claim 7 wherein the step of identifying output symbols that are members of a decodable set first examines output symbols with a lower weight before examining output symbols with a higher weight.

9. The method of claim 7 wherein the number of output symbols in the first set of output symbols is equal to K plus A, wherein A is a small percentage of K.

10. The method of claim 9 wherein if no additional input symbols can be recovered from the first set of output symbols and an adequate number of input symbols have not been recovered, then receiving G additional output symbols and the G newly received output symbols are organized and processed as the original K plus A output symbols were organized and processed.

11. The method of claim 7 wherein the step of recovering input symbols associated with the output symbols in the decodable set is deferred while other output symbol processing is occurring.

12. The method of claim 11 wherein the step of recovering input symbols associated with the output symbols in the decodable set is deferred until it is determined that an adequate number of input symbols can be recovered from the output symbols.

13. The method of claim 11 wherein the step of recovering input symbols associated with the output symbols in the decodable set is deferred until it is determined that the input symbols are needed.

14. A method for processing encoded data in a decoder, the method comprising:
- receiving a first set of output symbols at the decoder, wherein the output symbols are derived from an ordered set of input symbols representing a data that is to be recovered, wherein the number of possible output symbols is much larger than the number of input symbols, wherein the total number of input symbols is estimated to be equal to K, wherein at least one output symbol is generated from more than one, but less than all, of the input symbols in the ordered set of input symbols;
- organizing the output symbols in the first set of output symbols at the decoder, wherein organizing the output symbols comprises:
    - determining a key for each output symbol;
    - computing a weight for each output symbol;
    - computing a value for each output symbol; and
    - computing a functional index for each output symbol;
- processing the output symbols in the first set of output symbols to recover input symbols at the decoder; and
- processing the recovered input symbols to recover the data that is to be recovered at the decoder.

15. The method of claim 14 further comprising:
- sorting the output symbols using the weight of the output symbols at the decoder.

16. The method of claim 14 wherein the functional index of an output symbol is computed as the xor of the positions of any unrecovered input symbols in the ordered set of input symbols that are also associated with the output symbol.

17. The method of claim 15 wherein the weight for an output symbol is computed as a function of the number of input symbols, K, and the key of the output symbol.

18. The method of claim 14 wherein the value of each output symbol is computed using an output value function.

19. The method of claim 14 wherein the output value function is selected as a function of the number of input symbols, K, and the key of the output symbol.

20. The method of claim 14 wherein processing the output symbols to recover input symbols at the decoder comprises:
- (i) identifying a decodable set of output symbols from the first set of output symbols;
- (ii) recovering input symbols associated with the output symbols in the decodable set;
- (iii) reducing the weight of any output symbols that are not members of the decodable set but are associated with recovered input symbols using the recovered input symbols;
- (iv) recalculating the functional index of any output symbols that are not members of the decodable set but are associated with recovered input symbols using the recovered input symbols;
- (v) repeating steps (i)-(iv) until an adequate number of input symbols have been recovered or no additional input symbols can be recovered from the first set of output symbols.

21. The method of claim 20 wherein the step of identifying a decodable set of output symbols from the first set of output symbols first examines output symbols with a lower weight before examining output symbols with a higher weight.

22. The method of claim 20 wherein the number of output symbols in the first set of output symbols is equal to K plus A wherein A is a small percentage of K.

23. The method of claim 22 wherein if no additional input symbols can be recovered from the first set of output symbols and an adequate number of input symbols have not been recovered, then G additional output symbols are received and the G newly received output symbols are organized and processed as the original K plus A output symbols were organized and processed.

24. The method of claim 20 wherein the step of recovering input symbols associated with the output symbols in the decodable set is deferred while other output symbol processing is occurring.

25. The method of claim 24 wherein the step of recovering input symbols associated with the output symbols in the decodable set is deferred until it is determined that an adequate number of input symbols can be recovered from the output symbols.

26. The method of claim 24 wherein the step of recovering input symbols associated with the output symbols in the decodable set is deferred until it is determined that the input symbols are needed.

* * * * *